United States Patent [19]
Ota et al.

[11] Patent Number: 5,568,257
[45] Date of Patent: *Oct. 22, 1996

[54] ADJUSTING DEVICE FOR AN ALIGNMENT APPARATUS

[75] Inventors: Kazuya Ota, Tokyo; Hideo Mizutani, Yokohama; Kouichiro Komatsu, Tokyo, all of Japan

[73] Assignee: Nikon Corporation, Tokyo, Japan

[*] Notice: The term of this patent shall not extend beyond the expiration date of Pat. No. 5,347,356.

[21] Appl. No.: 441,062

[22] Filed: May 15, 1995

Related U.S. Application Data

[63] Continuation of Ser. No. 162,967, Dec. 8, 1993, abandoned, which is a continuation of Ser. No. 908,468, Jul. 6, 1992, abandoned.

[30] Foreign Application Priority Data

Jul. 9, 1991 [JP] Japan ................................ 3-168018

[51] Int. Cl.⁶ .............................. G01B 9/02; G01B 11/00
[52] U.S. Cl. ........................ 356/363; 356/349; 356/356; 356/401
[58] Field of Search .................................. 356/356, 363, 356/400, 349, 401

[56] References Cited

U.S. PATENT DOCUMENTS

| 4,371,264 | 2/1983 | Lacombat et al. | 356/363 |
|---|---|---|---|
| 4,643,577 | 2/1987 | Röth et al. | 356/363 |
| 4,659,225 | 4/1987 | Takahashi | 356/358 |
| 4,710,026 | 12/1987 | Magome et al. | 356/349 |
| 4,815,854 | 3/1989 | Tanaka et al. | 356/363 |
| 4,838,693 | 6/1989 | Uchida et al. | 356/363 |
| 4,870,452 | 9/1989 | Tanimoto et al. | 356/349 |
| 4,902,133 | 2/1990 | Tojo et al. | 356/363 |
| 5,070,250 | 12/1991 | Komatsu et al. | 250/548 |
| 5,118,953 | 6/1992 | Ota et al. | 250/548 |
| 5,151,749 | 9/1992 | Tanimoto et al. | 356/375 |
| 5,151,750 | 9/1992 | Magome et al. | 356/401 |
| 5,153,678 | 10/1992 | Ota | 356/401 |
| 5,160,849 | 11/1992 | Ota et al. | 250/548 |
| 5,214,489 | 5/1993 | Mizutani et al. | 356/363 |
| 5,347,356 | 9/1994 | Ota et al. | 356/363 |
| 5,351,150 | 9/1994 | Lichtman et al. | 359/232 |

FOREIGN PATENT DOCUMENTS

| 408381 | 1/1991 | European Pat. Off. | 356/363 |
|---|---|---|---|
| 1-89326 | 4/1989 | Japan | 356/363 |

*Primary Examiner*—Robert J. Warden
*Assistant Examiner*—E. Leigh Dawson
*Attorney, Agent, or Firm*—Shapiro and Shapiro

[57] ABSTRACT

The structure of an alignment apparatus is as follows: The illuminating areas of the two laser beams for the use of alignment, which are irradiated onto a diffraction grating on a substrate and a diffraction grating mark on a fiducial member, are relatively driven by a field diaphragm and a diaphragm member. A photoelectric detector receives the interference light generated from a first portion in the area on the above-mentioned diffraction mark where the two laser beams intersect following the above-mentioned relative driving, and receives the interference light generated from a second portion in the aforesaid area. A main control system calculates the intersecting angles or rotational error of the two laser beams on the basis of the phase difference of the detection signals from the aforesaid photoelectric detector. The intersecting angles or rotational error is corrected by allowing the parallel flat glasses, which are arranged on the light path, to be slanted.

19 Claims, 13 Drawing Sheets

ADJUSTING DEVICE FOR AN ALIGNMENT APPARATUS

This is a continuation of application Ser. No. 08/162,967 filed Dec. 8, 1993, which is a continuation of application Ser. No. 07/908,468, filed Jul. 6, 1992 both now abandoned.

BACKGROUND OF THE INVENTION

1. Field of the Invention

The present invention relates to an alignment apparatus having sensors capable of detecting the positions of a substrate with a resolution of nano meter (nm) order. More particularly, the invention relates to an apparatus for aligning a mask or reticle and a photosensitive substrate, which is suited for projection type aligners (stepper-aligner), a proximity type aligner, and others used for fabricating semiconductor devices or liquid crystal display elements.

2. Related Background Art

In recent years, in the lithography processes of semiconductor element fabrication, the step-and-repeat type reducing projection aligner (stepper) has been widely used as an apparatus for transferring the reticle pattern to a wafer with a high resolution. This has been accompanied by the evolution of higher integration of semiconductor devices, the development of shorter light wavelengths for exposure light and projection lenses having higher aperture number (N.A.) for a stepper of the kind. Recently, the resolution line width on the wafer has reached a sub-micron order (approximately 0.5 to 0.6 µm). In order to transfer such a high resolution image pattern as this, the precision of alignment (superposition) which corresponds to such resolution power is required. Therefore, it is conceivable that the alignment precision can be enhanced by increasing the detection resolution of an alignment sensor, for example.

A high resolution alignment sensor of the kind is disclosed in U.S. Pat. No. 4,710,026, for example. In this alignment sensor, one-dimensional interference fringes are produced on a diffraction grating mark by irradiating coherent parallel beams in two directions which are different from each other to the one-dimensional diffraction grating mark formed on the wafer. Further, there is proposed a system in which the intensity of the diffraction light (interference light) from the diffraction grating mark by the irradiation of the interference fringes is detected photoelectrically.

For this disclosed system, there are the heterodyne method providing a given frequency difference for the parallel beams in two directions and the homodyne method which does not provide any frequency difference. In the homodyne method, static interference fringes are produced in parallel to the diffraction grating mark, and when a position is detected, it is necessary to move the diffraction grating mark (object) finely in the direction of its pitches. The mark position is obtained with the interference fringes as reference. On the contrary, the interference fringes run at a high speed in the direction of its fringes (pitch direction) at the beat frequency in the heterodyne method because of the laser beam frequency difference (beat frequency) therein, and the mark position is not obtained with the interference fringes as reference, but it is obtained with the time element (phase difference) as reference, which mainly follows the high-speed shifting of the interference fringes.

For example, in the heterodyne method, by way of giving the frequency difference, a phase difference (within ±180°) is obtained between the photoelectric signal (light beat signal) detected from the interference light from the diffraction grating mark on the wafer by modulating its intensity with the beat frequency, and the light beat signal of the reference interference light produced separately from the two light carrier beams. Thus detecting any misregistrations within ±P/4 of the grating pitch P. Here, given a grating pitch P as 2 µm (line-and-space of 1 µm) and the resolution of the phase difference measurement as approximately 0.5°, the resolution for the misregisteration measurement will be $(P/4)\cdot(0.5/180) \approx 0.0014$ µm. Since a method of detecting mark positions such as this is of extremely high resolution, it is anticipated that the alignment precision is obtainable in the order of one digit high or more as-compared with the conventional mark position detection.

Now, in an alignment sensor of the kind, the intersecting angles of the two laser beams must be adjusted accurately so that a relational equation $P=m\cdot P'$ ($m=1, 2, \ldots$) is established between the grating pitch P and the pitch P' of the interference fringes and at the same time, the rotational error at the intersecting line of the plane including the major rays of light of the two laser beams with respect to the grating arrangement direction and the wafer surface must be set substantially at zero, that is, the interference fringes and diffraction grating must be set in parallel accurately. Otherwise it is impossible to utilize the advantage of high resolution sufficiently and there is a problem that the alignment precision can be lowered.

In the conventional art, therefore, the interference light from the grating mark is detected photoelectrically while changing the intersecting angles of the two laser beams. Then, there is obtained an intersecting angle at which the intensity of the interference light becomes the greatest, and the intersecting angles of the two laser beams are adjusted in order to set the pitch P' of the interference fringes accurately for the grating pitch P so that the above-mentioned relational equation can be satisfied.

On the other hand, as regards the rotational error at the intersecting line of the plane including the major rays of light of the two laser beams and the wafer surface, the interference light from the grating mark is sequentially detected photoelectrically while the diffraction grating mark (wafer) and interference fringes are being rotated relatively. Then, by rotating the grating mark and the interference fringes relatively to make the intensity of the interference light the greatest, the above-mentioned rotational error is set substantially at zero.

However, in the conventional art mentioned above, the maximum value of the diffraction light intensity (the voltage of light beat signal) is detected, that is, using a hill-climbing method, the intersecting angles or the rotational error of the two laser beams is measured and adjusted. In general, there is a fundamental problem for the hill-climbing method that the inclination (sensitivity) of signal changes is zero at the maximum value. Further, the intersecting angle and rotational error are calculated by monitoring its electrical level. It is therefore easier to receive the influence of noise or the like, and there is also a problem that a sufficiently accurate measurement cannot be obtained.

SUMMARY OF THE INVENTION

In consideration of the problems present in the conventional art, the present invention is designed. It is an object of the present invention to obtain an alignment apparatus capable of measuring and adjusting the intersecting angles (interference fringe pitches) of the two laser beams and the rotational error for alignment with a high precision at high speeds.

With a view of solving the above-mentioned problems, there are provided for an apparatus according to the present invention:

irradiating means for supplying two beams to a diffraction grating formed on a substrate to give irradiation in two directions at a predetermined intersecting angle, the irradiating means having an objective optical system, and a field diaphragm arranged in the plane which is substantially conjugate with the diffraction grating with respect to the objective optical system, and the two beams, which have passed this field diaphragm, passing the pupil plane of the objective optical system or the plane in the vicinity thereof apart from each other at a given space;

a photoelectric detector for receiving the interference light of the diffraction rays of light themselves generated from the diffraction grating substantially in the same direction;

alignment means for aligning the substrate at a given position on the basis of the detecting signals from the photoelectric detector;

a reference member having reference marks for the diffraction grating;

a control member arranged in the plane substantially conjugate with the reference member with respect to the objective optical system for controlling the areas in the above-mentioned plane where the two beams will pass so as to allow the two beams to be irradiated onto each of the plural areas on the reference mark sequentially; and calculating means for calculating at least one of the rotational error at the intersecting lines of the plane including the main light of the two beams in the direction of the grating arrangement of the reference mark, and the substrate, and the intersecting angles of the two beams, on the basis of the phase difference of the detecting signals from the photoelectric detector corresponding to the interference light generated from each of the plural local areas.

According to the present invention, the intersecting angles of the two beams irradiated onto the diffraction grating formed on the substrate in two directions, and the rotational error of the plane including the two beams for the direction of the grating arrangement of the diffraction grating and the substrate, are obtained from the phase difference information of the photoelectric signals (light beat signals) corresponding to the intensity of the diffraction light generated by the diffraction grating. As a result, it is unnecessary to search the signal level by the hill-climbing method. There is also no possibility that the measurement precision of the above-mentioned intersecting angles and rotational error is lowered even if the intensity of the diffraction light (that is, the voltage of the photoelectric signal) varies. Hence enabling the enhancement of the adjustment precision. Also, the illumination area of the two laser beams (the formation area of the interference fringes) and the diffraction grating are moved relatively by the diaphragm member. It is therefore possible to perform the measurement of the intersecting angles and rotational error with the stage being in a fixed (stopped) state thereby to enable the measurement and adjustment of the intersecting angles and rotational error with a high precision at high speeds irrespective of the accuracy with which the stage is being positioned. Further, it is possible to measure the intersecting angles and rotational error simultaneously for each of the plural alignment systems (four, for example). Accordingly, the measurement time, that is, the adjustment time, can also be shortened. Particularly, when the alignment system is structured to be movable in accordance with the kinds of reticles (sizes, reticle mark positions, and others), it is inevitable to adjust the intersecting angles and rotational error for each of the reticles due to the magnification error of the projection optical system caused by the wavelength difference of the exposure light and alignment light. Here, the present invention is advantageous because the adjustment can be made in a shorter period. Also, in conducting the above-mentioned measurement, a rotational disc (diaphragm member) provided with a plurality of circular slits is employed. Therefore, even if a slight error takes place in the stop position of the circular slit by the driving motor for the rotational disc, the illumination area regulated by the field diaphragm (fixed slit) and circular slit is not varied. Hence making it extremely easy to control the rotational disc, and there is an advantage that an inexpensive motor (and rotary encoder as well) can be employed.

BRIEF DESCRIPTION OF THE DRAWINGS

FIG. 5 is a view showing an example of the pattern configuration and arrangement of a reticle used for the superposition exposure for the second layer and on.

DETAILED DESCRIPTION OF THE PREFERRED EMBODIMENTS

Figure 1:
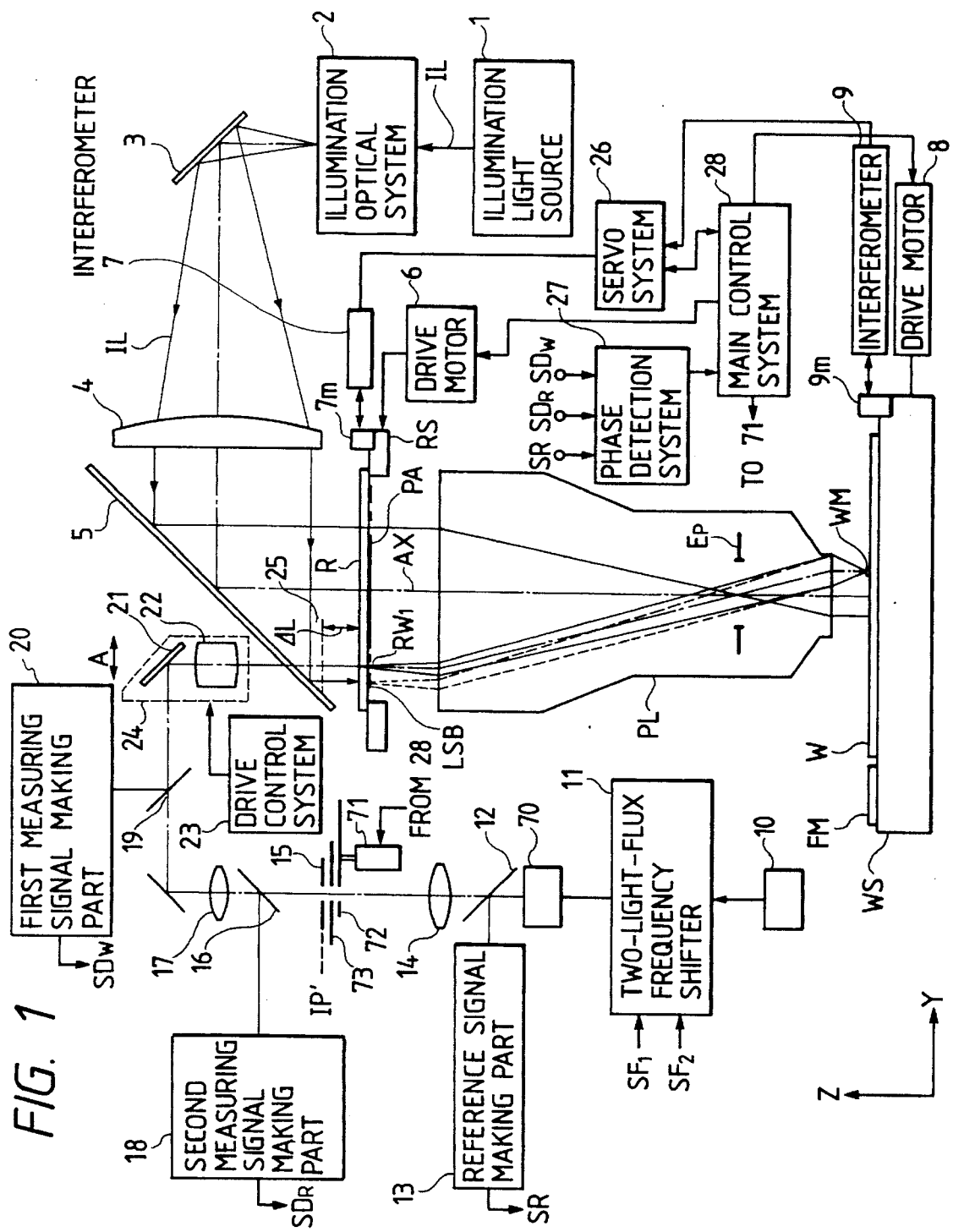
FIG. 1 is a view schematically showing the structure of the aligner provided with an alignment apparatus according to an embodiment of the present invention.

FIG. 1 is a view schematically showing the structure of a projection type aligner (stepper) provided with an alignment apparatus according to an embodiment of the present invention. In the present embodiment, an apparatus having an alignment sensor of TTR (Through The Reticle) type is exemplified particularly as the alignment apparatus. In this respect, the alignment sensor is, in the present embodiment, structured to be movable in accordance with the positional change of the reticle mark following the changes in the chip sizes of the semiconductor element or the possible damage on the wafer mark and the like due to various processes. Also, in FIG. 1, only one set of the alignment sensors (10 to 24 and 70 to 73) is shown, but it is assumed that in practice, four sets of alignment sensors are arranged for the transparent windows $RW_1$ to $RW_4$ (FIG. 5) for the reticle alignment, respectively.

In FIG. 1, an illumination light source 1 such as a super-high pressure mercury lamp and excimer laser device emits the exposure illumination light IL which has a wavelength area to cause a resist layer of g line, i line, or KrF excimer laser light to be exposed. The exposure light IL enters an illumination optical system 2 including an optical integrator (which includes fly-eye lens) and others. The exposure light IL, for which the light flux uniformity, speckle reduction, and the like are performed by the illumination optical system 2, reaches a dichroic mirror 5 through a mirror 3, main condenser lens 4. The dichroic mirror 5 reflects the exposure light IL from the main condenser lens 4 vertically downward to illuminate the reticle R with an even illuminance. Here, the dichroic mirror 5 is diagonally installed above the reticle R at an angle of 45 degrees and has a reflectivity of more than 90% against the wavelength of the exposure light IL while having a transmittance of more than 50% against the wavelength of the alignment illumination light (usually, longer than the wavelength of the exposure light).

For the reticle R, four sets of alignment transparent windows $RW_1$ to $RW_4$ (only $RW_1$ being shown) are formed in the light shielding band (chrome layer) LSB of a given width surrounding the pattern area PA. The reticle R is mounted on a reticle stage RS and is positioned to allow the center point of the pattern area PA to be matched with the optical axis AX. The reticle stand is structured to be movable two-dimensionally in its horizontal plane by a drive motor 6. At the end thereof, a movable mirror $7m$ is fixed to reflect the laser beam from a laser light wave interference type measuring apparatus (hereinafter referred to as interferometer) 7. The interferometer 7 always detects the two-dimensional positions of the reticle R with a resolution of approximately 0.01 μm, for example. The initial set up of the reticle R is conducted by moving the reticle stage RS finely on the basis of the mark detecting signals from a reticle alignment system (not shown) which detects the alignment marks in the periphery of the reticle photoelectrically.

Now, the exposure light IL having passed the pattern area PA enters a projection lens PL which is telecentric on both sides. The projection lens PL projects (images) the projected image of the circuit pattern on the reticle R by superposing it on a one-shot area on the wafer W on the surface of which the resist layer is formed. On the wafer W, a wafer mark WM is formed at a position close to the shot area with a given positional relation. A desirable chromatic aberration compensation is given to the projection lens PL with respect to the wavelength (g line, i line, and others) of the exposure light IL, and under such a wavelength, the reticle R and wafer W are arranged to be conjugative with each other.

Also, the wafer W is mounted on the wafer stage WS which is driven by the drive motor 8 two-dimensionally with its step-and-repeat method, and when the transfer exposure for the reticle R on a one-shot area of the wafer W is terminated, a stepping motion is given to move it to the next shot position. The two-dimensional position of the wafer stage WS is detected by the interferometer 9 with the resolution of approximately 0.01 μm, for example, and at the end of the wafer stage WS, a movable mirror $9m$ is fixed to reflect the laser beam from the interferometer 9.

Figure 4:
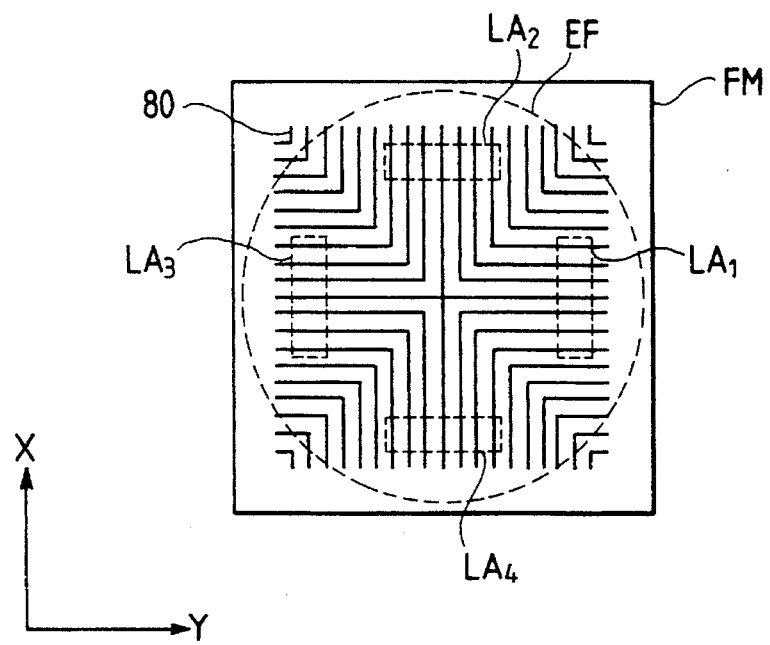
FIG. 4 is a view schematically showing an example of the structure of the diffraction grating mark (reference mark) formed on a reference member.

Further, on the wafer stage WS, there is arranged a fiducial member (glass substrate) FM provided with a fiducial mark of a diffraction grating type used for the adjustment of the intersecting angles and rotational error of the two beams ($LB_1$ and $LB_2$ which will be described later) in such a manner that the fiducial member is provided to match substantially with the surface position of the wafer W, for example. On the fiducial member FM, a diffraction grating mark 80 (duty being 1:1) formed by the irregular chrome layer having light reflectivity is prepared as the fiducial mark. FIG. 4 is a view schematically showing the structure of the diffraction grating mark 80 in which a pattern of plural bars extending each in the X and Y directions is arranged in the X and Y directions with pitches of 8 μm each, for example. In this respect, the circle EF which is indicated by a dotted line in FIG. 4 represents the exposure field of the projection lens PL, and the oblong area $LA_1$ to $LA_4$ represent the two-beam illumination area (the area where the interference fringes are formed) irradiated by each of the four sets of alignment sensors. Therefore, in the present embodiment, the fiducial member FM is transported under the projection lens PL, and by arranging the optical axis AX and the center of the diffraction grating mark 80 to be substantially matched, it becomes possible to measure the two-beam intersecting angles ore..rotational error with each of the four sets of the alignment sensors simultaneously.

Figure 5:
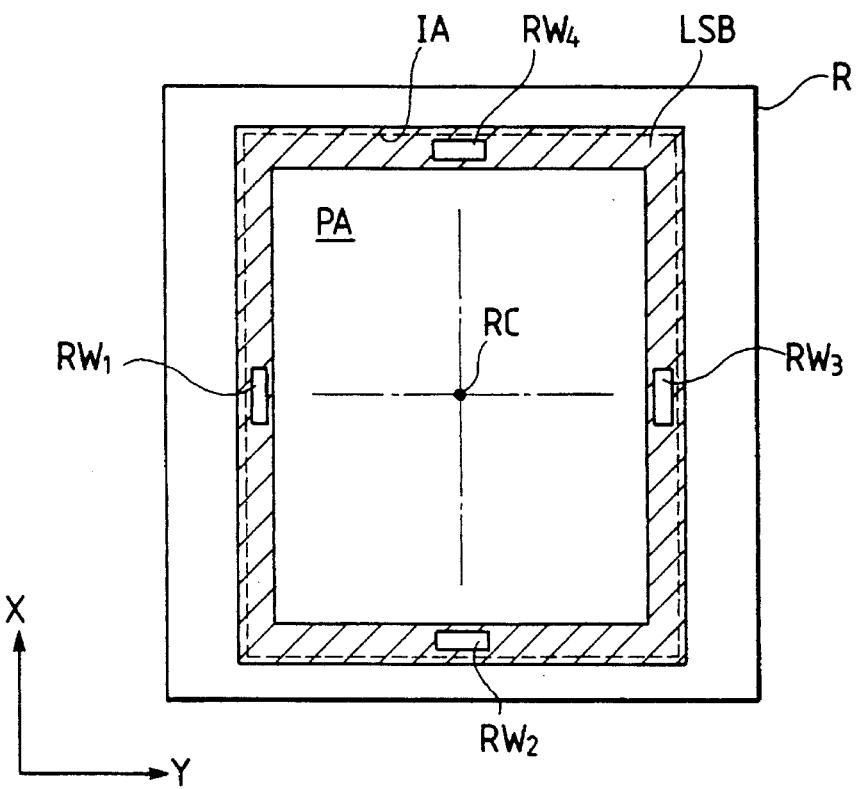

FIG. 5 is a view showing an example of the pattern configuration and arrangement of the reticle R used for the superposing exposure of the second layer and on, in which the transparent windows $RW_1$ to $RW_4$ are formed in the light shielding band LSB surrounding the pattern area PA in a position close to the pattern area PA. The transparent windows $RW_1$ and $RW_3$ are arranged facing each other on the lines parallel to the Y axis passing through the reticle center RC while the transparent windows $RW_2$ and $RW_4$ are arranged facing each other on the lines parallel to the X axis passing through the center RC. Also, the width of the shielding light band LSB is established at a value more than 1/M times the width of the street line on the wafer (where. M is the projection magnification of the projection lens PL), and the illumination area IA of the exposure light IL regulated by a variable blind, which is not shown, is established for the size of a range including the pattern area PA and transparent windows $RW_1$ to $RW_4$ (or perhaps only the transparent portion $RS_1$ which will be described later), that is, the size which can cover a one-shot area and street lines on the four circumferential sides on the wafer.

Figure 6:
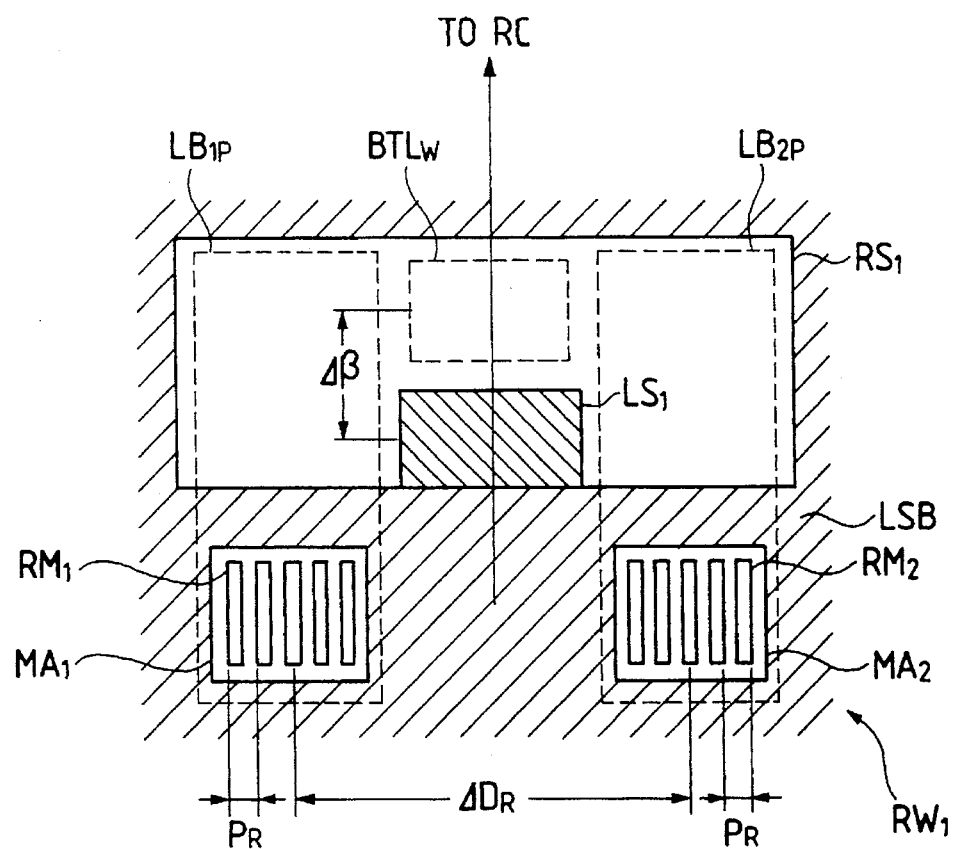
FIG. 6 is a view showing the specific structure of a transparent window for alignment.

FIG. 6 is a view showing an example of the specific structure of the transparent window $RW_1$ of the reticle R. The transparent window $RW_1$ is structured with an oblong transparent portion $RS_1$ and mark areas $MA_1$ and $MA_2$. The transparent portion $RS_1$ allows the alignment beams $LB_{1P}$ and $LB_{2P}$ and the diffraction light of specific order (interference light $BTL_W$) of the beams $LB_{1P}$ and $LB_{2P}$ at wafer mark WM to be passed at the same time, (which will be described later). The mark areas $MA_1$ and $MA_2$ are provided with a given interval $\Delta D_R$, and the reticle marks $RM_1$ and $RM_2$ (duty being 1:1) of diffraction grating type are formed in the respective areas all with the pitch $P_R$.

Also, the light shielding portion $LS_1$ (chrome layer) is formed in the transparent portion $RS_1$, and at the time of exposure, the wafer mark $WM_1$ is protected by this light shielding portion $LS_1$. More specifically, when a projection image of the pattern area PA and a shot area on the wafer to be exposed are accurately superposed, the magnification chromatic aberration amount $\Delta\beta$ of the projection lens PL (here, the value on the reticle) should appropriately be defined more than a certain value in accordance with the size of the transparent portion $RS_1$ and wafer mark WM using a wavelength area different from the exposure light IL as the alignment illumination light, such as a single wavelength laser beam having a wavelength of more than 530 nm with almost no resist photosensitivity, so that the light shielding portion $LS_1$ and the wafer mark WM will be in an imaging relation (indicated by dotted line in FIG. 1) under the wavelength of the exposure light IL. At this juncture, the projection image of the transparent portion $RS_1$ under the wavelength of the exposure light IL should be formed in a position deviating from the wafer mark WM to the shot area by an amount ($\Delta\beta \cdot M$) corresponding to the amount of the magnification chromatic aberration.

Figure 2:
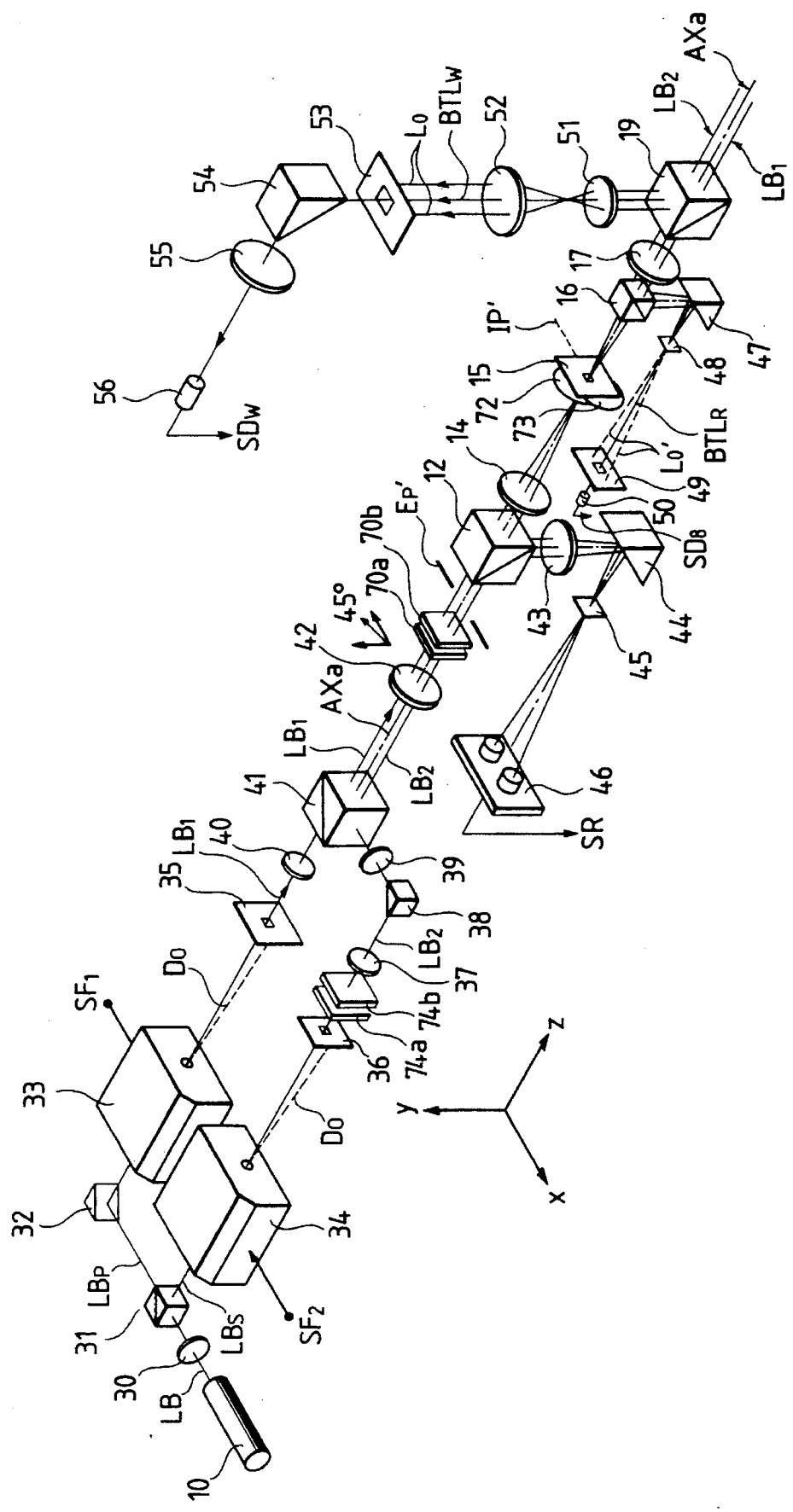
FIG. 2 is a perspective view showing the specific structure of the alignment system shown in FIG. 1.
Figure 3:
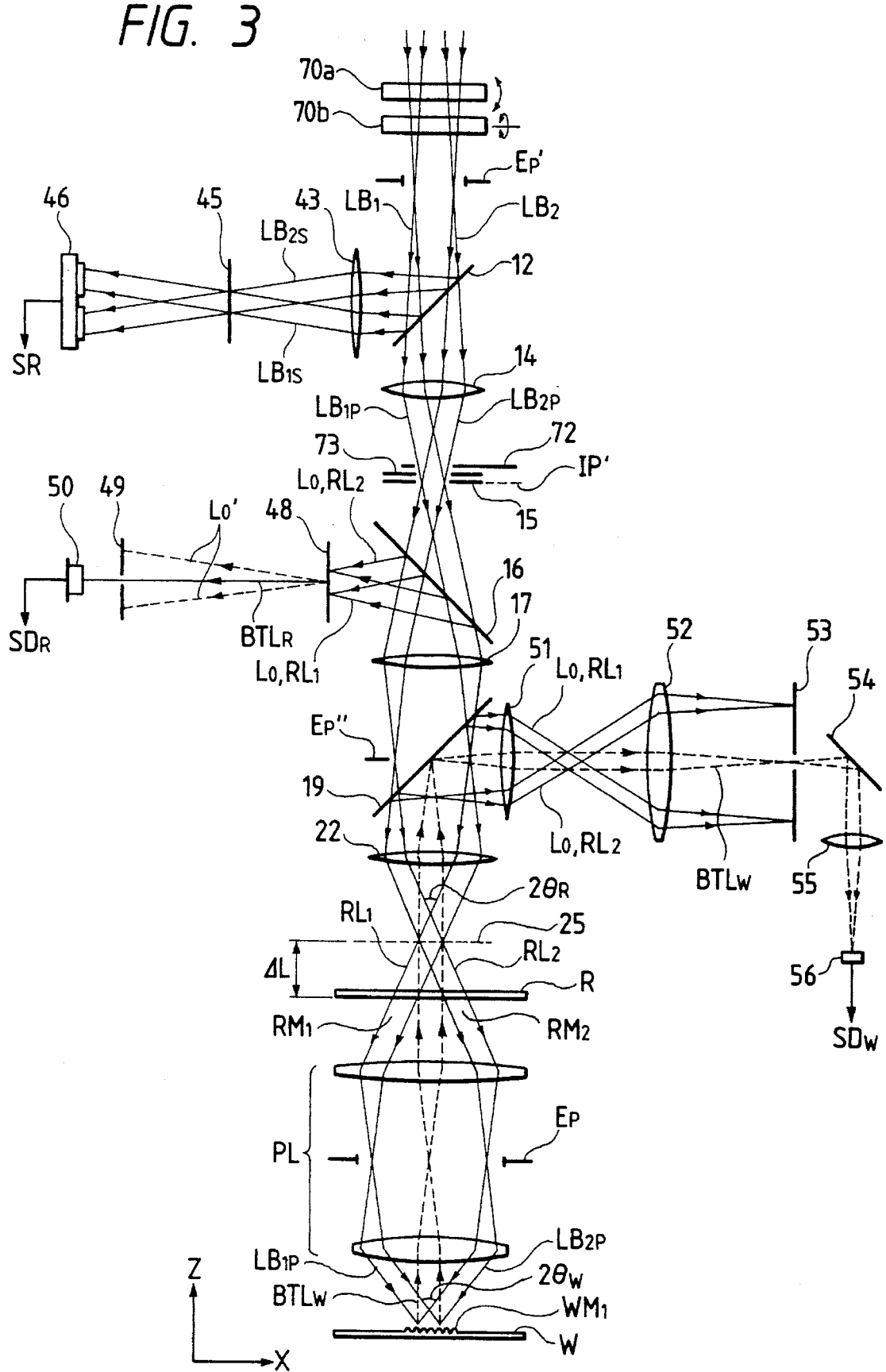
FIG. 3 is a view illustrating the main part of the alignment system shown in FIG. 1 further in detail.

Now, using both FIG. 2 and FIG. 3, the detailed description will be given of a TTR type alignment sensor according to the present embodiment. FIG. 2 is a perspective view showing the specific structure of the alignment sensor, and FIG. 3 is a view showing the main part of the alignment sensor further in detail. In FIG. 3, the dichroic mirror 5 and mirror 21 shown in FIG. 1, and mirrors 44 and 47 in FIG. 2 are omitted.

As shown in FIG. 2, the laser light source 10 generates the alignment illumination light (laser beam) LB of a linearly polarized light (P polarization light, for example), and the beam LB reaches a polarized light beam splitter (PBS) 31 after its axis of the polarized light having been rotated approximately 45 degrees to the incident plane through a ½ (or ¼) wavelength plate 30, where it is split into the polarized p light beam $LB_P$ and polarized s light beam $LB_S$ substantially in an equal quantity of light, respectively. The illumination light LB is a laser beam having a wavelength area different from the wavelength area of the exposure light IL and becomes an He-Ne laser of a wavelength 633 nm having almost no photosensitivity against the resist layer, for example.

Now, the polarized p light beam $LB_P$ having passed the PBS 31 enters through a mirror 32 a first acoustooptic modulator (AOM) 33 which serves as a frequency shifter, and the polarized s light beam $LB_S$ reflected by the PBS 31 enters a second acoustooptic modulator (AOM) 34. The AOM 33 is driven by the high frequency signal $SF_1$ of a frequency $f_1$ and outputs a primary light which is deflected only by the diffraction angle determined by the frequency $f_1$ as the beam $LB_1$. On the other hand, the AOM 34 is driven by the high frequency signal $SF_2$ of a frequency $f_2$ ($f_2=f_1-\Delta f$) so that difference frequency with the beam $LB_1$ having the frequency $f_1$ becomes $\Delta f$, and likewise, outputs a primary light which is deflected only by the diffraction angle determined by the frequency $f_2$ as the beam $LB_2$.

Here, the beams $D_O$ emitted from the AOMs 33 and 34 other than the emitted beams of + primary light are shielded by the slits 35 and 36 arranged at appropriate positions. In the present embodiment, the driving frequencies $F_1$ and $F_2$ of the AOM 33 and 34 are assumed to be at 80.000 MHz and 79.950 MHz, for example, and as the difference frequency $\Delta f$ is set at as low as 50 KHz, the diffraction angles of the primary diffraction light in the two AOMs 33 and 34 become equal. In this respect, it may be possible to use an optical waveguide, for example, as a frequency shifter for the beams $LB_P$ and $LB_S$.

The polarized p light beam $LB_1$ emitted after having been modulated into a frequency $f_1$ by the AOM 33, enters through a lens 40 the half plane beam splitter (HBS) 41 which is arranged on the pupil plane of the alignment system or in the vicinity thereof. On the other hand, the polarized s light beam $LB_2$ emitted, after having been modulated into a frequency $f_2$ by the AOM 34, is converted into the polarized p light by the function of the ½ wavelength plate 37 after passing through two parallel plane flat glasses 74a and 74b (referred to herein simply as "parallel flat glasses"), and enters the HBS 41 through a mirror 38 and lens 39. In this respect, the parallel flat glasses 74a and 74b are structured to be able to incline independent of each other by a driving unit (not shown) in the traveling direction of the beam $LB_2$.

Here, when the parallel flat glass 74a is inclined one-dimensionally to shift the beam $LB_2$ for a minute amount, the pupil plane of the alignment system (beam waist position), which is, for example, the spot of the beam $LB_{2P}$ at the pupil plane Ep of the projection lens PL, is driven in the direction of grating arrangement (in the present embodiment, the direction X) of the wafer mark WM, it becomes possible to adjust the interval between the respective spots of the beams $LB_{1P}$ and $LB_{2P}$, that is, the intersecting angles $2\theta_W$ of the beams $LB_{1P}$ and $LB_{2P}$. On the other hand, if the parallel flat glass 74b is inclined, the spot of the beam $LB_{2P}$ is driven at the pupil plane Ep in the direction substantially perpendicular (the direction Y) to the direction of the grating arrangement, it becomes possible to conduct the rotational adjustment around the Z axis of the plane including both of the main rays of light of the beams $LB_{1P}$ and $LB_{2P}$.

In this respect, it is also possible to adjust the spot positions at the pupil plane Ep by arranging one parallel flat glass diagonally in the traveling direction of the beam $LB_2$ two-dimensionally instead of the two parallel flat glasses 74a and 74b. Moreover, it may be possible to adopt a structure such that the beam $LB_1$ is also shifted by arranging the above-mentioned one or two parallel flat glasses in the light path of the beam $LB_2$ between a slit 35 and a lens 40, for example. In this case, there is no need for the parallel flat glasses 70a and 70b, which will be described later, to be arranged.

The HBS 41 has a total reflection mirror, although not shown in FIG. 2, deposited on half its contacting plane, and by arranging the beam $LB_2$ to enter here, it is reflected in a quantity of light which is almost 100% while allowing the beam $LB_1$ to pass the transparent portion of the contacting plane as it is. The HBS 41 is not arranged to synthesize the beams $LB_1$ and $LB_2$ completely coaxially but to synthesize the beams $LB_1$ and $LB_2$ in parallel to each other with an interval of a predetermined amount. In this way, the main rays of light of the two polarized p light beams $LB_1$ and $LB_2$ are made parallel to each other and at the same time, these beams are positioned symmetrically with the optical axis AXa of the alignment system therebetween. In this respect, the two-light beam frequency shifter 11 in FIG. 1 comprises the members from the ½ wavelength plate 30 to the HBS 41 in the sequence of the reference numerals and the parallel flat glasses 74a and 74b.

Now, the two polarized p light beams $LB_1$ (frequency $f_1$) and $LB_2$ (frequency $f_2$), which are emitted from the HBS 41 with its main rays of light in parallel, enter the parallel flat glasses 70a and 70b (corresponding to the member 70 in FIG. 1), which are arranged between the pupils of the alignment system diagonally in relation to the optical axis AXa, after both of them having been rotated approximately 45 degrees in the polarization direction by the function of the ½ wavelength plate 42. The parallel flat glasses 70a and 70b are independently driven by a driving unit which is not shown. In the present embodiment, these flat glasses can be inclined one-dimensionally in relation to the optical axis AXa. Further, the polarized p light beams $LB_1$ and $LB_2$ reach the polarized light beam splitter (PBS) 12 after having been once converged in a spot fashion by the lenses 40 and 39 described earlier at the pupil plane Ep' of the alignment system (the plane almost conjugative with the incident pupil Ep at the position of beam waist) or in the vicinity thereof (FIG. 3). In the PBS 12, the beam $LB_1$ is separated into a polarized p light beam $LB_{1P}$ and polarized s light beam $LB_{1S}$ of frequency $f_1$ while the beam $LB_2$ are separated into a polarized p light beam $LB_{2P}$ and polarized s light beam $LB_{2S}$ of frequency $f_2$.

Here, if at least one of the parallel flat glasses 70a and 70b is inclined, each spot can be moved one- or two-dimensionally at the pupil planes Ep' and Ep" or Ep of the alignment system with each interval of the spots of the beams $LB_{1P}$ and $LB_{2P}$ remaining unchanged as predetermined. Thus, it becomes possible to make the adjustment of an inclination of the main rays of light of the two beams, which serve as the bisector for the beams $LB_{1P}$ and $LB_{2P}$, in relation to the optical axis AXa of the alignment system (hereinafter simply referred to as telecen inclination). This is needed because in adjusting the intersecting angles $2\theta_W$ and the rotational error $\omega$ of the two beams $LB_{1P}$ and $LB_{2P}$, only the beam $LB_2$ is shifted by the parallel flat glasses 74a and 74b in the two light flux frequency shifter 11, and there may occur a necessity that the telecen inclination is corrected following the inclination of the parallel flat glasses 74a and 74b.

As shown in FIG. 3, too, the two polarized s light beams $LB_{1S}$ (frequency $f_1$) and $LB_{2S}$ (frequency $f_2$) reflected by the PBS 12 enter a reference signal making part 13 (FIG. 1) comprising a lens system (reverse Fourier transform lens) 43 for converting a pupil into an image plane, mirror 44, reference diffraction grating 45 arranged at the rear side of the focus plane of the lens system 43, and photoelectric detector 46. The two beams $LB_{1S}$ and $LB_{2S}$ are reflected by the mirror 44 through the lens system 43 and caused to enter the reference diffraction grating 45 fixed on the apparatus in two different directions as the parallel light beams at a given intersecting angle and form an image (intersection). The photoelectric detector 46 has two sets of light receiving elements (or two-divisional light receiving element) to receive (convert photoelectrically) independently an interference light of the 0th light of the beam $LB_{1S}$ having passed the reference diffraction grating 45 and the + primary diffraction light of the beam $LB_{2S}$ which travels coaxially therewith, and an interference light of the − primary diffraction light of the beam $LB_{1S}$ and the 0th light of the beam $LB_{2S}$ which travels coaxially therewith, for example. The sinusoid photoelectric signals corresponding to the intensities of these two rays of interference light are added by an amplifier which is not shown, and the resultant photoelectric signal SR shows a frequency proportional to the difference frequency $\Delta f$ of the beams $LB_{1S}$ and $LB_{2S}$ and becomes a light beat signal. Here, the grating pitch of the reference diffraction light 45 is established to be equal to the pitch of the interference fringes produced by the beams $LB_{1S}$ and $LB_{2S}$. Also, in this respect, it may be possible to arrange the photoelectric detector 46 to receive the above-mentioned two interference rays of light on the one and same light receiving plane and output the photoelectric signal added on this light receiving plane in accordance with the intensities of the interference light.

On the other hand, the two polarized p light beams $LB_{1P}$ (frequency $f_1$) and $LB_{2P}$ (frequency $f_2$) having passed the PBS 12 become parallel rays of light inclined at a given angle by the lens 14, and are emitted from the lens 17 through the beam splitter (NBS) 16 after having been once intersected by the field diaphragm 15 arranged at the rear side focus plane of the lens 14 (substantially conjugative plane with the wafer) IP'. Thus, as shown in FIG. 3, each of the main rays of light of the beams $LB_{1P}$ and $LB_{2P}$ is substantially in parallel to the optical axis AXa of the alignment system, and becomes the imaging light flux as a spot which is converged at each of the two points substantially point symmetrical with the optical axis AXa therebetween at the pupil plane EP" (beam waist position). In this respect, according to the present embodiment, there are provided in addition to the field diaphragm 15, two sets of diaphragm members 72 and 73 used for measuring the intersecting angles $2\theta_W$ and rotational error $\omega$ of the two beams $LB_{1P}$ and $LB_{2P}$ positioned extremely close to each other and to the diaphragm 15. Therefore, at the time of the above-mentioned measurement, the illumination areas of the two beams $LB_{1P}$ and $LB_{2P}$ are regulated by the field diaphragm 15 and the diaphragm member 72 or 73 (which will be described later in detail).

Further, the beams $LB_{1P}$ and $LB_{2P}$ are emitted to the dichroic mirror 54 in the direction perpendicular thereto through the beam splitter (NBS) 19, mirror 21 and telecentric objective lens 22 and are arranged to irradiate the transparent window $RW_1$, that is, each of the reticle marks $RM_1$ and $RM_2$ after having been once intersected at the focus plane 25 at an intersecting angle of $2\theta_R$ (which is uniquely defined by the intersecting angle $2\theta_W$ on the wafer which will be described later) and separated on the pattern plane of the reticle R. In this respect, the focus plane 25 (rear side focus plane of the objective lens 22) is substantially conjugative with the wafer surface under the wavelength of the alignment illumination light LB, and the interval between this focus plane 25 and the pattern plane of the reticle R corresponds to the dichroic axial aberration amount $\Delta L$ of the projection lens PL. Therefore, the interval $\Delta D_R$ (FIG. 6) between the reticle marks $RM_1$ and $RM_2$ is defined as $\Delta D_R = 2 \cdot \Delta L \cdot \tan \theta_R$.

Now, the beams $LB_{1P}$ and $LB_{2P}$ irradiate the reticle marks $RM_1$ and $RM_2$ (FIG. 6) and at the same time, parts thereof pass the transparent portion $RS_1$ to enter the projection lens PL. Thus being converged once at the incident pupil Ep like spots so that they are almost spot symmetrical in relation to the center of the pupil (optical axis AX). Subsequently, they will become the parallel beams inclined at symmetrical angles to each other with the optical axis AX therebetween in relation to the pitch direction of the wafer mark WM and enter the wafer mark WM in the two different directions at intersecting angles $2\theta_W$ to form an image (intersection). In this respect, the intersecting angles $2\theta_W$ of the beams $LB_{1P}$ and $LB_{2P}$ do not exceed the aperture number (N.A.) of the exit (wafer) side of the projection lens PL even when they are large. Also, the direction of the straight line connecting each of the spots of the beams $LB_{1P}$ and $LB_{2P}$ formed to be substantially spot symmetrical with the optical axis AX therebetween at the incident pupil Ep and the pitch direction of the wafer mark WM are almost identical.

Now, when the beams $LB_{1P}$ and $LB_{2P}$ enter the wafer mark WM at the intersecting angles $2\theta_W$, one-dimensional interference fringes are produced at a pitch $P_F$ (defined as $P_F=P_W/2$ in the present embodiment) which is 1/N times the pitch $P_W$ of the wafer mark WM (where N is a natural number) in an arbitrary plane perpendicular to the optical axis AX in the spatial area where the beam $LB_{1P}$ and $LB_{2P}$ are intersected. These interference fringes are shifted (flown) in the pitch direction of the wafer mark WM (direction X) in accordance with the difference frequency $\Delta f$ of the beams $LB_{1P}$ and $LB_{2P}$, and its velocity V can be expressed by a relational expression, $V=\Delta f \cdot P_F$. Also, the intersecting angles $2\theta_W$ are defined to satisfy the following expression (1) where $\lambda$ is the wavelength of the alignment illumination light LB:

$$\sin\theta_W = \lambda/P_W \qquad (1)$$

As a result, there is generated from the wafer mark WM the ± primary diffraction light which becomes a beat wave plane repeating the light and shade changes periodically due to shifting interference fringes, and these diffraction rays of light are coaxially synthesized and reversely travel along the optical axis AX to pass the center of the incident pupil Ep. These two diffraction rays of light, having one and the same polarized light component (polarized p light component), interfere with each other to become a light beat (interference light) BTLw, and will return to the NBS 19 through the projection lens PL, transparent window $RW_1$ of reticle R, dichroic mirror 5, objective lens 22, and mirror 21, where it is reflected to enter a first measuring signal making part 20 (FIG. 1) comprising an afocal enlarging relay systems 51 and 52, spatial filter 53, mirror 54, condenser lens 55, and photoelectric detector 56.

In the first measuring signal making part 20, the interference light BTLw from the wafer mark WM reaches the spatial filter 53 which is arranged substantially conjugative with the incident pupil Ep through the afocal enlarging relay system 51 and 52. Here, the 0th light Lo of the reflection light which returns to exactly the same axis of the main rays of light of the beams $LB_{1P}$ and $LB_{2P}$ and the primary diffraction rays of light $RL_1$ and $RL_2$ (which will be described later in detail) from the reticle marks $RM_1$ and $RM_2$ are cut, and only the interference light BTLw is extracted. Further, the interference light BTLw is received by the photoelectric detector 56 through the mirror 54, and condenser lens 55. The photoelectric detector 56 produces photoelectric signals corresponding to the interference light BTLw. The photoelectric signals thus produced are output to a phase detecting system 27 as sinusoid alternating current signals in accordance with the cycle of the light and shade changes of the interference light, that is, the light beat signal $SD_W$ having the beat frequency of a difference frequency $\Delta f$. In this respect, if the photoelectric detector 56 is arranged immediately behind the spatial filter 53, the installation of the condenser lens 55 is not required as a matter of course.

Here, in the first measuring signal making part 20, it may be possible to receive by the photoelectric detector independently an interference light of the 0th light of the beam $LB_{1P}$ which returns coaxially to the aforesaid main rays of light of the beam $LB_{1P}$ and $LB_{2P}$ exactly and the + secondary diffraction light of the beam $LB_{2P}$, and an interference light of the − secondary diffraction light of the beam $LB_{1P}$ and the 0th light of the beam $LB_{2P}$ on the plane substantially conjugative with the incident pupil Ep (the surface of the spatial filter 53), respectively, besides the + primary diffraction light (diffraction light) BTLw. In this case, the sinusoid photoelectric signals which correspond to the intensities of these two interference rays of light are added by an amplifier which is not shown, and the resultant photoelectric signal (light beat signal) is output to the phase detecting system 27. Then, this light beat signal is used instead of the light beat signal $SD_W$ of the aforesaid interference light BTLw, or there is no problem even if this light beat signal and the aforesaid light beat signal $SD_W$ is used as the case may be: for example, in accordance with the signal amplitudes or the like. At this juncture, it is necessary that the field diaphragm is positioned in a position substantially conjugative with the wafer W between the afocal enlarging relay systems 51 and 52 and the primary diffraction rays of light $RL_1$ and $RL_2$ from the reticle marks $RM_1$ and $RM_2$ are cut to extract only the above-mentioned two interference rays of light.

On the other hand, the grating pitch $P_R$ of the reticle marks $RM_1$ and $RM_2$ irradiated by the beam $LB_{1P}$ and $LB_{2P}$ (FIG. 3) is defined by the following expression (2) in accordance with the intersecting angles $2\theta_R$ of the beams $LB_{1P}$ and $LB_{2P}$ on the focus plane 25:

$$P_R = \frac{\lambda}{2\sin\theta_R} = \frac{\lambda}{2M\sin\theta_w} = \frac{P_W}{2M} \qquad (2)$$

where M is the projection magnification of the projection lens PL.

Therefore, the primary diffraction ray of light $RL_1$ (frequency $f_1$) emitted from the reticle mark $RM_1$ and the primary diffraction ray of light $RL_2$ (frequency $f_2$) emitted from the reticle mark $RM_2$ will return to the NBS 16 coaxially to each of the main rays of light of the beam $LB_{1P}$ and $LB_{2P}$ exactly through the dichroic mirror 5, objective lens 22, and mirror 21, NBS 19 and lens 17, where it is reflected to enter a second measuring signal making part 18 (FIG. 1) comprising a mirror 47, transparent fiducial grating plate 48, spatial filter 49 and photoelectric detector 50. The fiducial grating plate 48 is arranged at the rear side focus plane of the lens 17 (wafer conjugate plane) and the primary diffraction rays of light $RL_1$ and $RL_2$ enter the fiducial grating plate 48 as parallel rays of light in the two different directions through the mirror 47 at predetermined intersecting angles to form an image (intersection). In this way, one-dimensional interference fringes are produced on the fiducial grating plate 48, which flow in the pitch direction of the grating in accordance with the difference frequency $\Delta f$.

Here, in the present embodiment, the magnification between the focus plane 25 and the fiducial grating plane 48 is assumed to be equal (one time) for the simplification of the description and the grating pitch $P_{GR}$ of the fiducial grating plate 48 is assumed to be defined as $P_{GR}=P_R$. Also, the 0th light Lo emitted from the wafer mark WM returns coaxially to the main rays of light of the beams $LB_{1P}$ and $LB_{2P}$ and is allowed to irradiate the fiducial grating plate 48 in the two different directions together with the primary diffraction rays of light $RL_1$ and $RL_2$. However, on the surface of the fiducial grating plate 48 (wafer conjugate plane), the 0th light Lo and primary rays of light $RL_1$ and $RL_2$ (interference fringes) reflected by the mark WM on the wafer surface are separated in an image spatially. Here, therefore, it should be good enough if the fiducial grating plate 48 is arranged in the wafer conjugate plane in accordance with the sizes and positions of the interference fringes by the primary diffraction rays of light $RL_1$ and $RL_2$.

As a result, when the primary diffraction rays of light $RL_1$ and $RL_2$ enter the fiducial grating plate 48, the ± primary diffraction rays of light are emitted coaxially from the fiducial grating plate 48, and the interference light $BTL_R$ (parallel light beams) is received by the photoelectric detector 50 through the spatial filter 49. The 0th light Lo' from the fiducial grating plate 48 is shielded by the spatial filter 49. The photoelectric signal from the photoelectric detector 50 which corresponds to the interference light $BTL_R$ becomes a sinusoid alternating current signal (light beat signal of the beat frequency) $SD_R$ in accordance with the cycle of the light and shade changes of the interference fringes and is output to the phase detecting system 27.

Now, as shown in FIG. 1, the phase detecting system 27 detects the phase difference in the waveforms of the light beat signal SR produced by the reference signal making part 13 as a reference signal, the light beat signals $SD_W$ and $SD_R$ produced by the first measuring signal making part 20 and the second measuring signal making part 18, respectively, and obtains the relative phase difference between the two light beat signals $SD_W$ and $SD_R$ to output this phase difference information to the main control system 28. The main control system 28 calculates the relative positional deviation amount between the reticle mark $RM_1$ and wafer mark WM with a high precision within the range of $\pm P_W/4$ of the grating pitch $P_W$ on the basis of the phase difference information from the phase detecting system 27, and further, controls the servo system 26 which functions as interface for both of the interference systems 7 and 9, drive motors 6 and 8, and phase detecting system 27 integrately. Besides, it calculates the intersecting angles $2\theta_W$ (pitch $P_f$ of the interference fringes) and rotational error $\omega$ of the two beams $LB_{1P}$ and $LB_{2P}$ on the basis of the aforesaid phase difference information to adjust the inclination angles of the parallel flat glasses 70a and 70b, and 74a and 74b in accordance with the values thus calculated.

Now, in FIG. 1, the mirror 21 and objective lens 22 of the alignment system are integrately fixed in the holding metal 24 which is movable by a driving control system 23 in the left- and right-hand directions along the arrow A. By the movement of this holding metal 24, the observing position of the objective lens 22 is freely changeable on the line running in the irradiation direction through the reticle center RC at least on the reticle R. Here, accompanying the shift of the observing position of the objective lens 22, the interference light BTLw from the wafer mark WM and the 0th light Lo are not separated on the light receiving plane of the photoelectric detector 56, for example, and there is a possibility that they are partially overlaid. Therefore, in the present embodiment, the movement stroke of the objective lens 22 (the metal 24) is established so that any 0th light Lo is not mixed with the interference light BTLw. As the most preferable condition, the pupil plane Ep" of the objective lens 22 should be at the beam waist position, that is, it is positioned to be conjugative with the spatial filter 53 when the metal 24 is positioned at the center of the movement stroke for the observation. In this state, the beam waist of the interference light BTLw should only be arranged to pass just the center of the aperture of the spatial filter 53. In this respect, the alignment system shown in FIG. 1 is made movable in the direction perpendicular to the plane of FIG. 1 substantially along the pattern area PA in response to the relocations (positional changes) of the alignment mark (transparent window) due to a damage or the like on the wafer mark by various processes.

Here, a brief description will be given of the alignment of the reticle R and wafer W by the alignment system structured as described above. As shown in FIG. 3, when the two beams $LB_{1P}$ and $LB_{2P}$ are irradiated onto the transparent window $RW_1$, the primary diffraction rays of light $RL_1$ and $RL_2$ generated by the reticle marks $RM_1$ and $RM_2$ enter the fiducial grating plate 48. The photoelectric detector 50 receives the interference light $BTL_R$ from the fiducial plate 48 to output the light beat signal $SD_R$ to the phase detecting system 27. Thus, the phase detecting system 27 obtains a phase difference $\Phi_R$ for the light beat signal SR which the photoelectric detector 46 has output as a reference signal, and stores the phase difference. In this case, the deviation amount $\Delta X_R$ of the reticle R is calculated by the equation given below.

$$\Delta X_R = \frac{P_R}{2} \times \frac{\phi_R}{2\pi}$$

On the other hand, the beams $LB_{1P}$ and $LB_{2P}$ having passed the transparent window $RW_1$ irradiate the wafer mark WM. The photoelectric detector 56 extracts only the interference light BTLw from the wafer mark WM and receives it, and outputs the light beat signal $SD_W$ to the phase detecting system 27. The phase detecting system 27 obtains a phase difference $\Phi_W$ for the light beat signal SR for the reference use and stores it. At this juncture, the deviation amount $\Delta X_W$ of the wafer W is calculated by the equation given below.

$$\Delta X_W = \frac{P_W}{2} \times \frac{\phi_W}{2\pi}$$

Now, the phase detecting system 27 outputs the phase differences $\Phi_R$ and $\Phi_W$ previously obtained to the main control system 28. On the basis of this phase difference information, the main control system 28 calculates a relative positional deviation amount $\Delta X$ between the reticle R and wafer W by the equation given below, where $M_{AL}$ is a projection magnification under the alignment wavelength of the projection lens PL, and the deviation amount $\Delta X$ is a value on the wafer W.

$$\Delta X = X_W - M_{AL} \times X_R = \frac{\lambda \cdot M_{AL}}{4\pi\theta_R} \left( \phi_W - \frac{\phi_R}{2} \right)$$

Consequently, the main control system 28 causes the reticle stage RS or wafer stage WS to be minutely moved by the use of the servo system 26 so that the above-mentioned deviation amount $\Delta X$ can be a given value or zero. Hence enabling the projection image of pattern area PA of reticle R and the shot area on wafer W to be matched accurately. In this case, when the deviation amount $\Delta X$ is brought into a predetermined allowable range (±0.06 μm, for example), an exposure light IL is irradiated to the illumination area IA through the illumination optical system 2. Also, in conducting the alignment, it may be possible to servo control the reticle stage RS or wafer stage WS to make the relative phase difference between the two light beat signals obtained by the phase detecting system 27 without using the servo system 26. In this respect, it may also be possible to define the pitch of the interference fringes produced by the primary diffraction rays of light $RL_1$ and $RL_2$ in the second measuring signal making part 18 and the grating pitch of the fiducial grating plate 48 to be equal so that the light beat signal $SD_R$ can be obtained in the same manner as the method adopted by the reference signal making part 13. Also, it may be possible to obtain the relative phase difference by comparing the above-mentioned two light beat signals $SD_W$ and $SD_R$ directly in the phase detecting system 27 without using any reference light beat signal SR.

Figure 7:
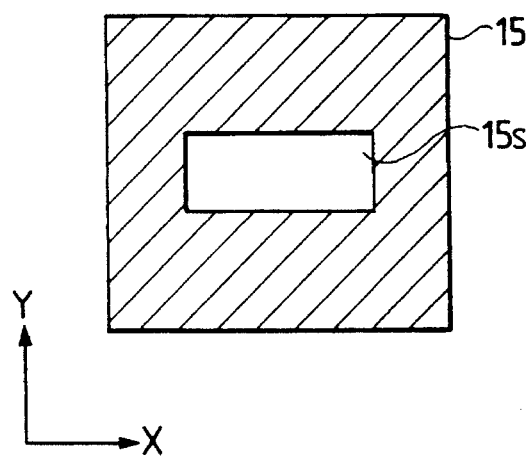
FIG. 7 is a view showing an example of the field diaphragm employed for the alignment system shown in FIG. 1.

Subsequently, with reference to FIG. 7 to FIG. 9, a structural example of three sets of field diaphragm members 15, 72, and 73 will be described briefly. FIG. 7 is a view showing an example of the field diaphragm 15. The field diaphragm 15 has an oblong aperture 15s to regulate the maximum illumination area of the two beams $LB_{1P}$ and $LB_{2P}$ (corresponding to $LA_1$ in FIG. 4, for example).

Figure 8:
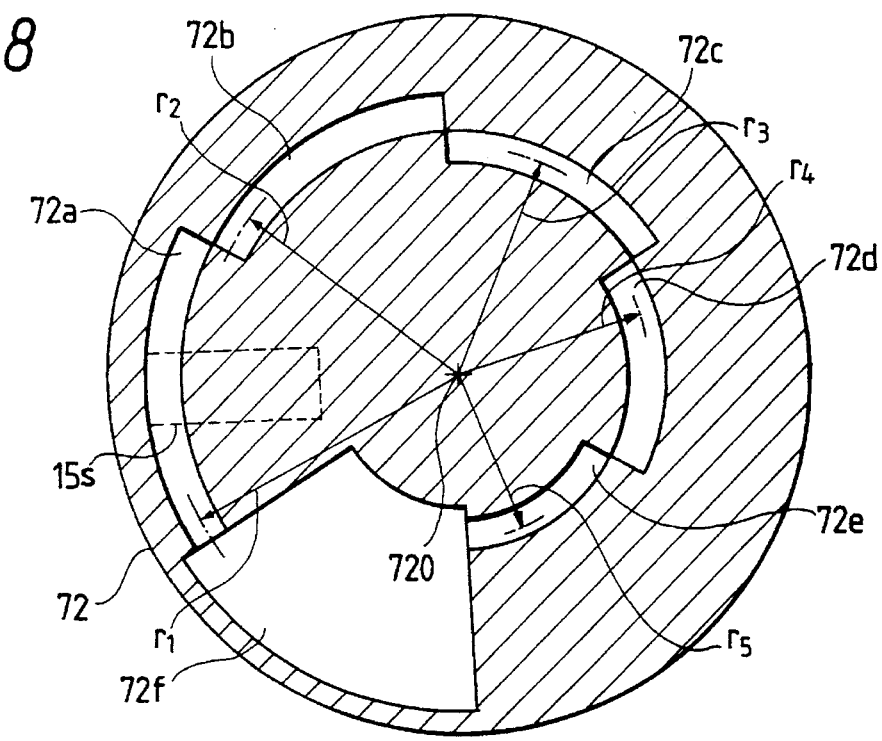
FIG. 8 is a view showing an example of the diaphragm member suited for the measurement of two-beam intersecting angles (interference fringe pitches).

FIG. 8 is a view showing an example of a diaphragm suited for adjusting the intersecting angles $2\theta_W$ of the beams $LB_{1P}$ and $LB_{2P}$. As shown in FIG. 8, the diaphragm 72 is a diaphragm formed by a rotational disc on which a plurality (five in FIG. 8) of circular slits 72a to 72e and a fan type aperture 72f are provided, and each of the light transmitting portions is arranged to be relatively rotative by a driving portion 71 with respect to the aperture 15s of the field diaphragm 15. Accordingly, when the intersecting angles (pitch of the interference light) are measured, the illuminating areas of the two beams $LB_{1P}$ and $LB_{2P}$ should be regulated either by the oblong aperture 15s or the slits 72a to 72e. Here, it is assumed that each of the slits 72a to 72e is formed so that the distances from the disc center 72o (radii $r_1$ to $r_5$) differ from each other and at the same time, the width of each of the slits in the radial direction is made equal.

Figure 9:
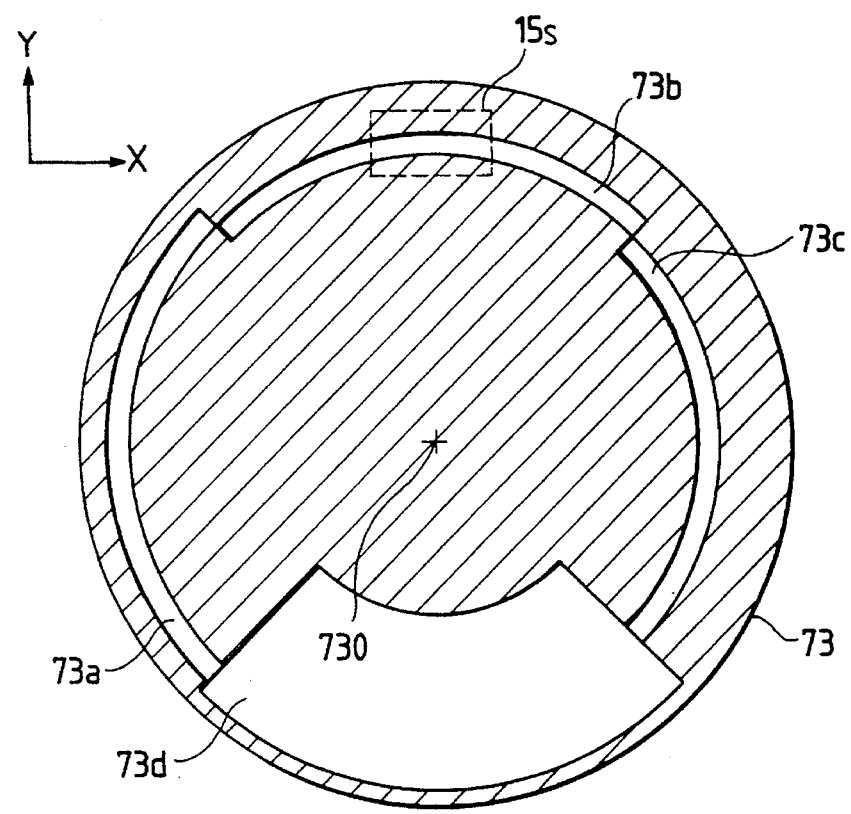
FIG. 9 is a view showing an example of the diaphragm member suited for the measurement of the rotational error of the two beams.

FIG. 9 is a view showing an example of the diaphragm member suited for adjusting the rotational error $\omega$ of the beam $LB_{1P}$ and $LB_{2P}$ (interference fringes). As shown in FIG. 9, the diaphragm member 73 is a diaphragm formed by a disc on which a plurality (three in FIG. 9) of circular slits 73a to 73c and a fan type aperture 73d, and each of the transmitting portions is arranged to be relatively rotative by a driving portion, which is not shown, with respect to the oblong aperture 15s. Therefore, when a rotational error is measured, the illumination areas of the two beams $LB_{1P}$ and $LB_{2P}$ are defined either by the oblong aperture 15s or the slits 73a to 73c. It is assumed that each of the slits 73a to 73c is formed so that the distances from the disc center 73o (radii) differ from each other and at the same time, the width of each of the slits in the radial direction is made equal.

In this respect, each of the apertures 72f and 73d of the diaphragm members 72 and 73 is made sufficiently larger than the oblong aperture 15s of the diaphragm 15, and when no measurement is conducted for the intersecting angles nor for the rotational error, that is, when the alignment of the reticle and wafer is conducted, each of them is positioned to be overlapped with the oblong aperture 15s. Also, when an intersecting angle measurement is conducted, the aperture 73d of the diaphragm member 73 is overlapped with the oblong aperture 15s while a rotational error is measured, the aperture 72f of the diaphragm member 72 is overlapped therewith.

Now, FIG. 8 shows a state in which the slit 72a is overlapped with the oblong aperture 15s (dotted line), and on the wafer, only the area corresponding to this overlapped portion should be irradiated by the beams $LB_{1P}$ and $LB_{2P}$. As a result, by rotating the diaphragm member 72, the slits 72a to 72e and aperture 72f are relatively moved with respect to the oblong aperture 15s, respectively, and are allowed to overlap with it sequentially. Accompanying this, the illumination areas of the beams $LB_{1P}$ and $LB_{2P}$ on the wafer are also moved in the direction of the grating arrangement (direction X). This state of event will be described briefly using FIG. 10.

Figure 10:
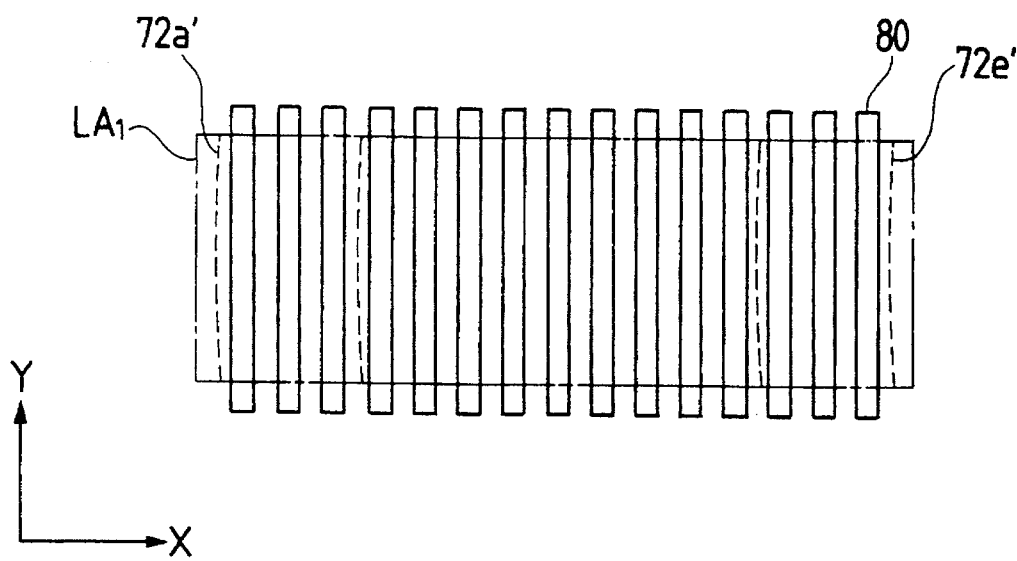
FIG. 10 is a view used for the explanation of the measurement operation of the intersecting angles of the two beams.

FIG. 10 illustrates the state in which the beams $LB_{1P}$ and $LB_{2P}$ are being irradiated onto the diffraction grating mark 80, and the oblong area (alternate long and short dash line) $LA_1$ represents the projection image of the oblong aperture 15s, that is, the maximum illumination area. As shown in FIG. 8, when the oblong aperture 15s and the slit 72a are overlapped, the illumination areas of the beams $LB_{1P}$ and $LB_{2P}$ are confined to the local area 72a' surrounded by the alternate long and short dash line and dotted line in FIG. 10, and a part of the diffraction grating mark 80, that is, only three bar patterns on the left-hand side in FIG. 10, is irradiated. In FIG. 8, therefore, when the diaphragm member 72 is being rotated in counter-clockwise direction in FIG. 8, the illumination area (local area) of the beams $LB_{1P}$ and $LB_{2P}$ is sequentially shifted in the direction of the grating arrangement (direction X) of the diffraction grating mark 80 in relation to each of the slits 72a to 72e, and when the oblong aperture 15s and the slit 72e are overlapped, only three bar patterns (local area 72e') on the right-hand side of the diffraction grating mark 80 are irradiated.

On the other hand, FIG. 9 shows the state in which the slit 73b is overlapped with the oblong aperture 15s (dotted line), and the illumination areas of the beams $LB_{1P}$ and $LB_{2P}$ on the wafer are only this overlapped portion. Accordingly, by rotating the diaphragm member 73, each of the slits 73a to 73c and aperture 73d is relatively moved with respect to the oblong aperture 15s and is overlapped therewith sequentially. Accompanying this, the illumination areas of the beams $LB_{1P}$ and $LB_{2P}$ on the wafer are being shifted in the direction Y. This state will be described briefly using FIG. 11.

Figure 11:
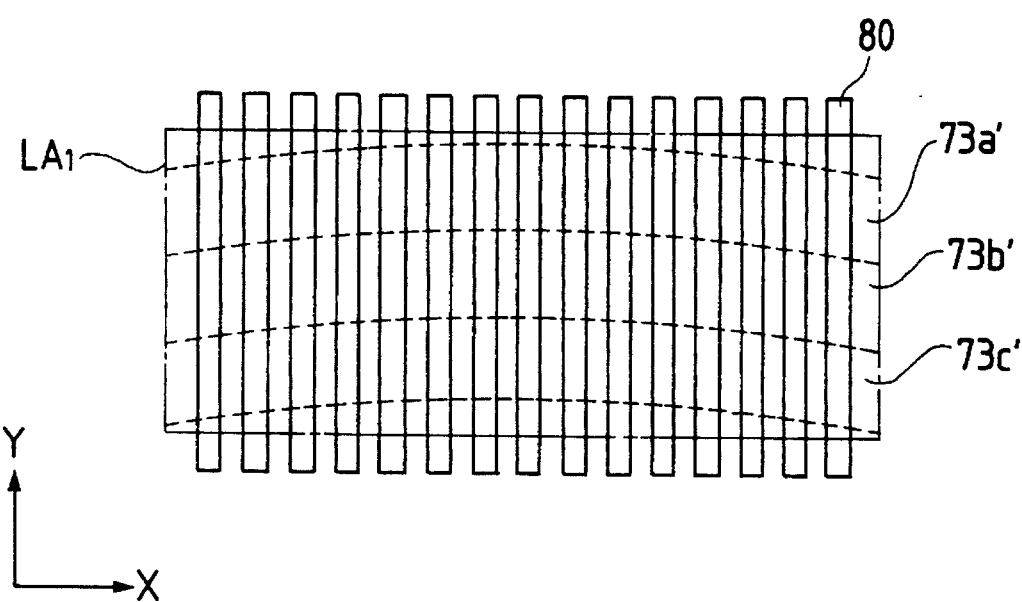
FIG. 11 is a view used for the explanation of the measurement operation of the rotational error of the two beams.

FIG. 11 illustrates the state in which the beams $LB_{1P}$ and $LB_{2P}$ are being irradiated onto the diffraction grating mark 80, and the oblong area (alternate long and short dash line) $LA_1$ represents the maximum illumination area. As shown in FIG. 9, when the oblong aperture 15s and the slit 73b are overlapped, the illumination areas of the beams $LB_{1P}$ and $LB_{2P}$ are confined to a local area 73b' surrounded by the alternate long and short dash line and dotted line in FIG. 11. In FIG. 9, therefore, when the diaphragm member 73 is being rotated counter-clockwise in the plane of FIG. 9, the illumination area (local area) of the beams $LB_{1P}$ and $LB_{2P}$ is also being shifted in the longitudinal direction (direction Y) of the bar patterns constituting the diffraction grating mark 80 sequentially with respect to the slits 73a to 73c (73a'+73b'+73c').

Here, there is no problem in defining arbitrarily the shifting amounts (which are uniquely defined by the radius and width of each of the slits on the rotational disc) Lx and Ly in the directions X and Y in the illumination area on the above-mentioned diffraction grating mark 80, but in practice, they are defined by the required precision with which the intersecting angle and rotational error should be measured, the pitch and length of the diffraction grating mark 80, and others. For example, the shifting amount Lx of the illumination area in the direction X in FIG. 10 may be defined as $Lx = n \cdot P_W/2 = n \cdot P_f$ (where n is a natural number). In the present embodiment, n=6 particularly so that the above-mentioned relational expression can be satisfied, and each of the radii and slit widths of the slits 72a to 72e is defined on the diaphragm member 72 accordingly.

Also, in order to ascertain which of the slits 72 and 73 is overlapped with the oblong aperture 15s, it is desirable to provide each of the two sets of driving portions (only 71 being shown) with a rotary encoder (or a discriminating mark such as a notch (cut off) for the diaphragm members 72 and 73 to perform this detection) or the like. In this respect, it is not necessarily required to provide the driving portion with a highly precise sensor. Further, the number of the circular slits to be arranged for the diaphragm members 72 and 73 is not necessarily five or three. It will suffice if only two or more slits are formed with the radii which differ from each other so as to irradiate at least two local areas different from each other in the maximum illumination area $LA_1$ of the beams $LB_{1P}$ and $LB_{2P}$. Also, the radius direction width and the length in the circumferential direction of each of the slits of the diaphragm members 72 and 73 can be arbitrarily set if only they can allow at least two local areas different from each other to be irradiated in the maximum illumination area $LA_1$.

Figure 12A:
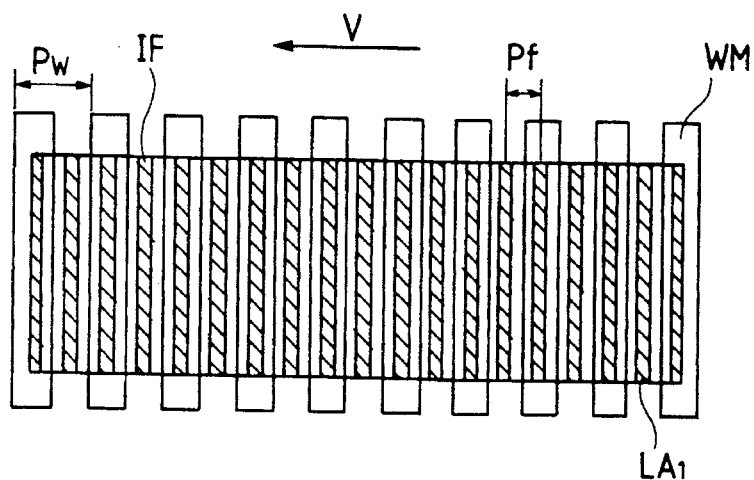
FIG. 12A and FIG. 12B are views used for the explanation of the measurement operation of the two-beam intersecting angles.
Figure 12B:
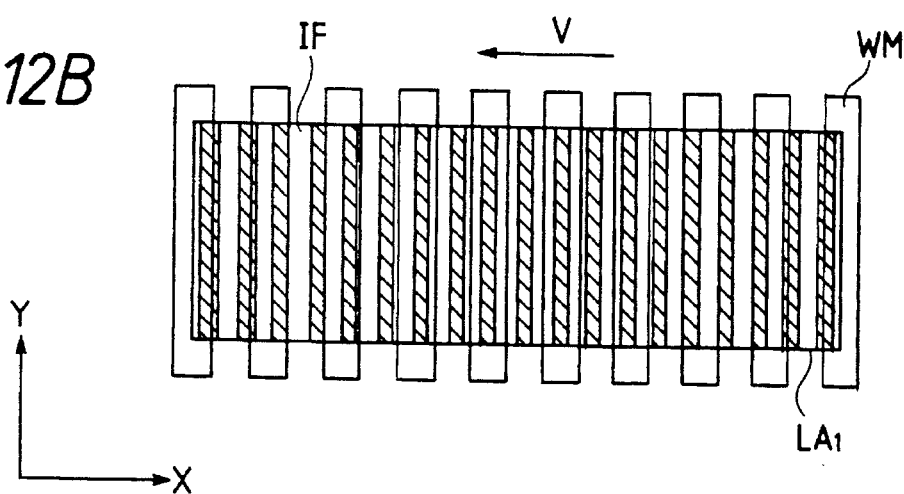

Now, a description will be given of the operation of an apparatus according to the present embodiment. At first, the operation on the measurement and adjustment for the intersecting angles of the two beams $LB_{1P}$ and $LB_{2P}$ (pitch of the interference light) will be described. Now, when the beams $LB_{1P}$ and $LB_{2P}$ are irradiated on the wafer mark WM as shown in FIG. 12A, the interference fringes (within the oblique lines in FIG. 12A being dark fringes) IF are generated, and the interference fringes IF flow in the direction X with respect to the wafer mark WM at a velocity V corresponding to the difference frequency $\Delta f$ between the beams $LB_{1P}$ and $LB_{2P}$. At this juncture, if the above-mentioned expression (1) is satisfied between the intersecting angles $2\theta_W$ of the beams $LB_{1P}$ and $LB_{2P}$ and the grating pitch $P_W$, the ± primary diffraction light from the grating mark is generated in one and the same direction and at the same time, the pitch $P_f$ of the interference fringes becomes exactly half of the grating pitch $P_W$. However, if the intersecting angles $2\theta_W$ do not satisfy the above-mentioned expression (1), the pitch $P_f$ of the interference fringes is not $P_W/2$ as shown in FIG. 12B. Consequently, the generating directions of the ± primary diffraction light becomes different and the measuring precision of the positional deviation can be degraded.

Therefore, the main control system 28 causes the wafer stage WS to be driven by the motor 8, and as shown in FIG. 10, the fiducial member FM is driven to the irradiating positions of the beams $LB_{1P}$ and $LB_{2P}$. Thus, the diffraction mark 80 is set in the illumination area $LA_1$. In this case, it is assumed that the diaphragm members 72 and 73 are set at the positions so that its apertures 72f and 73d are overlapped with the oblong aperture 15s. Then, the irradiation of the beams $LB_{1P}$ and $LB_{2P}$ is started onto the diffraction grating mark 80 and at the same time, the main control system 28 causes the driving portion 71 to rotate the diaphragm 72. As a result, the irradiation areas of the beams $LB_{1P}$ and $LB_{2P}$ are being shifted on the diffraction grating mark 80 in the direction of the grating arrangement (direction X) sequentially. When the oblong aperture 15s and the slit 72a are overlapped, the phase detecting system 27 receives the light beat signal $SD_W$ output from the photoelectric detector 56 (that is, the photoelectric signal corresponding to the intensity of the interference light from the three bar patterns in the local area 72a'), and obtains the phase difference $\Phi_{W1}$ with respect to the light beat signal SR which serves as a reference signal. Thus outputting this phase difference information to the main control system 28. At this juncture, it may be possible to conduct the phase difference measurement for several times while the oblong aperture 15s and the slit 72a are being overlapped to output the mean value of such measurements to the main control system 28 as a phase difference $\Phi_{W1}$. Thereafter, with the same operation, the phase detecting system 27 detects the phase differences $\Phi_{W2}$ to $\Phi_{W5}$ between the light beat signal $SD_W$ output from the photoelectric detector 56 each at the time of the oblong aperture 15s being overlapped with each of the slits 72b to 72e and the reference signal SR sequentially, and outputs each of them to the main control system 28.

Here, in detecting the above-mentioned phase differences $\Phi_{W1}$ to $\Phi_{W5}$, the diaphragm member 72 is being rotated continuously, and it may be possible to make an arrangement so that the phase detecting system 27 detects the phase differences $\Phi_{W1}$ to $\Phi_{W5}$ with respect to the reference signal SR on the basis of the light beat signal $SD_W$ output from the photoelectric detector 56 when each of the angular positions of the slits 72a to 72e on the diaphragm member 72 is matched with the information of the angular positions from the driving portion 71 (rotary encoder), for example. Also, it may be possible to detect the phase differences $\Phi_{W1}$ to $\Phi_{W5}$ each for the slits while rotating the diaphragm member 72 by each of the given angles in accordance with the angular intervals of the slits 72a to 72e on the diaphragm member 72.

Figure 13:
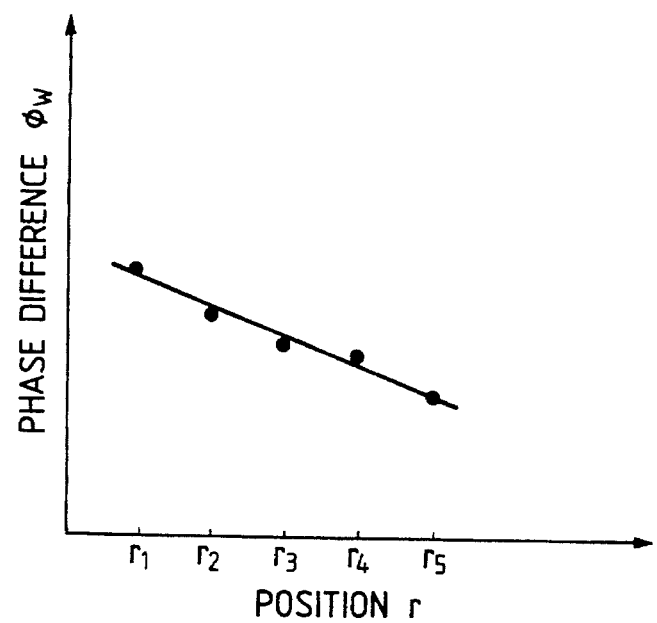
FIG. 13 is a graph used for the explanation of the measurement operation of the two-beam intersecting angles.

FIG. 13 is a collective representation of the results of the above-mentioned detections and shows the positions of the slits 72a to 72e (radius r), that is, the phase difference $\Phi_W$ at each position of the irradiation area in the direction X on the diffraction grating mark 80. Here, if the pitch $P_f$ of the interference fringes is exactly half the grating pitch $P_W$, each of the measured values (phase differences $\Phi_{W1}$ to $\Phi_{W5}$) at slits 72a to 72e is equal. In other words, as shown in FIG. 13 the inclination of the approximate straight line which is obtainable from each measured value (black dot in FIG. 13) should become zero. In practice, however, $P_f$ is not necessarily equal to $P_W/2$. Thus, the main control system 28 calculates the deviation amount $\Delta P_f$ of the pitch $P_f$ of the interference fringes with respect to the grating pitch $P_W$ of the diffraction grating mark 80 on the basis of the aforesaid phase difference information ($\Phi_{W1}$ to $\Phi_{W5}$). Here, the deviation amount $\Delta P_f$ is calculated from the variable amounts of the phase differences $\Phi_{W1}$ to $\Phi_{W5}$ (that is, the inclination of the straight line in FIG. 13) in each of the irradiation areas on the diffraction grating mark 80.

Now, a brief description will be given of a calculating method for the deviation amount $\Delta P_f$. As described above, FIG. 13 represents the relation between the slit positions (radius r) and phase difference $\Phi_W$. Here, the relation is linear. In FIG. 13, the black dots represent the actual data, and the solid line represents a straight line obtained by fitting such data to the respective linear functions by the method of least squares. Now, the linear function fitting by the method of least squares will be described. In this respect, while the method of least squares is adopted for fitting the linear functions, there is no problem in adopting a method of minimizing the largest amount of deviation for the data, for example. Here, the model function can be expressed in the equation (6) given below.

$$\Phi_W = K_1 \cdot r + K_2 \qquad (6)$$

where the $K_1$ and $K_2$ are unknown numbers obtainable by the method of least squares. Also, each of the data regarding the radius of each slit and actual phase difference is given as $r_i$ and $\Phi_{Wi}$. The subscript i corresponds to each of the slits formed on the diaphragm member 72 (FIG. 8). Further, an evaluation function S is given as follows:

$$S = \sum_{i=1}^{N} [(k_1 \cdot r_i + k_2) - \phi_{Wi}]^2$$

In this respect, N is a number of slits provided for the diaphragm member. Now, the unknown numbers $K_1$ and $K_2$ which make the evaluation function S the smallest are obtainable from the formula (9) given below by solving the following simultaneous equations with two unknowns (8) according to the theory of the method of least squares:

$$\frac{\partial S}{\partial k_1} = 0, \frac{\partial S}{\partial k_2} = 0 \tag{8}$$

$$\begin{pmatrix} k_1 \\ k_2 \end{pmatrix} = \begin{pmatrix} \sum_{i=1}^{N} r_i^2 & \sum_{i=1}^{N} r_i \\ \sum_{i=1}^{N} r_i & N \end{pmatrix}^{-1} \begin{pmatrix} \sum_{i=1}^{N} r_i \cdot \phi_{Wi} \\ \sum_{i=1}^{N} \phi_{Wi} \end{pmatrix} \tag{9}$$

Therefore, the unknown number (inclination) $K_1$ can be expressed as in the equation (10) given below from the above-mentioned formula (9).

$$k_1 = \frac{N \cdot \Sigma r_i \cdot \phi_{Wi} - \Sigma r_i \cdot \phi_{Wi}}{N \cdot \Sigma r_i^2 - (\Sigma r_i)^2} \tag{10}$$

As a result, the deviation amount $\Delta P_f$ can be calculated from the following relational equation (11):

$$\frac{\Delta P_f}{P_f} = k_1 \cdot \frac{P_f}{2\pi} \tag{11}$$

Now, the main control system 28 calculates the angles of inclination of the parallel flat glass 74a and, the angles of inclination of the parallel flat glass 70a for correcting the telecen inclination of the beams $LB_{1P}$ and $LB_{2P}$ generated accompanying the inclination of the parallel flat glass 74a, on the basis of the deviation amount $\Delta P_f$ of the pitch $P_f$ of the interference fringes obtained as described above. After that, the parallel flat glass 74a is driven to shift the spot of the beam $LB_{2P}$ in the direction X on the pupil plane Ep. Thus adjusting the intervals between each of the spots of the beams $LB_{1P}$ and $LB_{2P}$. Further, the parallel flat glass 70a is driven and, while the intervals between each of the spots of the beams $LB_{1P}$ and $LB_{2P}$ are being kept constant, each of the spots are shifted in the direction X so that each of them is positioned substantially symmetrical with the pupil center (optical axis X) therebetween. Thus correcting the telecen inclination of the beams $LB_{1P}$ and $LB_{2P}$. As a result, the adjustment of the intersecting angles of the beams $LB_{1P}$ and $LB_{2P}$ is completed, and the pitch $P_f$ of the interference fringes is set exactly half the grating pitch $P_W$ without generating any telecen inclination of the beams $LB_{1P}$ and $LB_{2P}$ on the exit side of the projection lens PL.

In this respect, according to the present embodiment, the deviation amount $\Delta P_f$ i's obtained from the inclination of a straight line (FIG. 13) as described above, it is possible to enhance the calculating accuracy for the inclination of the straight line, that is, the detecting precision of the deviation amount $\Delta P_f$ by increasing the number of the irradiation areas on the diffraction grating mark 80, that is, increasing the number of circular slits provided for the diaphragm member 72. In the present embodiment, even if the number of the circular slits is increased in such a manner, there will be no drawback that it may take a longer time to perform a measurement (adjustment) in detecting the phase differences because the operation is carried out only by rotating the diaphragm member 72.

Figure 14A:
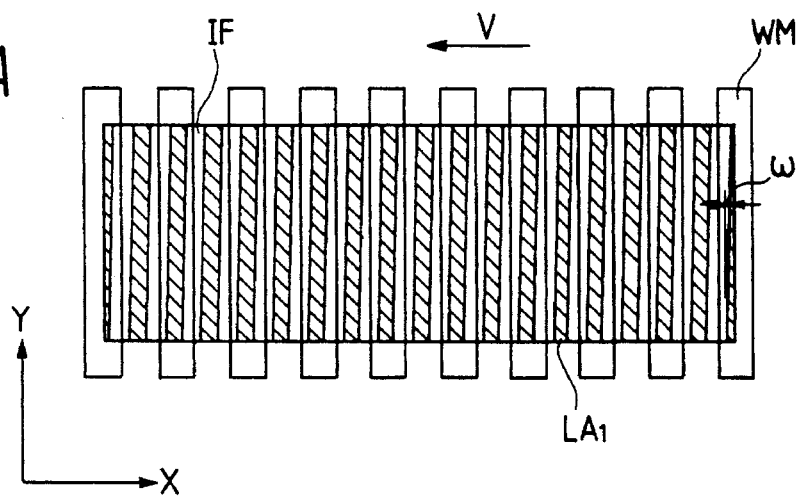
FIG. 14A and FIG. 14B are views used for the explanation of the measurement operation of the rotational error of the two beams.
Figure 14B:
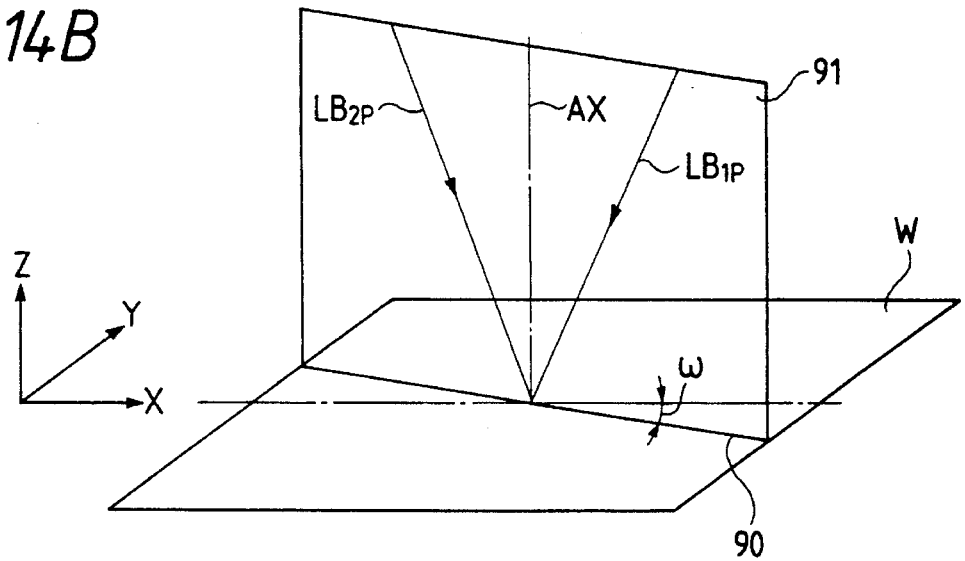

Subsequently, a description will be given of the operation on the measurement and adjustment for the rotational error of the beams $LB_{1P}$ and $LB_{2P}$. This operation is exactly the same as the above-mentioned operation on the measurement of the intersecting angles with the exception of the diaphragm member which will be used. Here, the description will be given briefly. As shown in FIG. 14A, if the intersecting line 90 of the plane 91 including the main rays of beams $LB_{1P}$ and $LB_{2P}$ and the wafer surface is rotated at an angle ω with respect to the measurement direction, that is, the direction of the grating arrangement (direction X), the interference fringes of the beams $LB_{1P}$ and $LB_{2P}$ are relatively rotated (FIG. 14B) with respect to the wafer mark WM (rectangular coordinate system XY). Hence, the measurement precision for the positional deviation can be degraded.

Therefore, subsequent to having set the diffraction grating mark 80 within the irradiation areas $LA_1$ of the beams $LB_{1P}$ and $LB_{2P}$, the main control system 28 starts allowing the beams $LB_{1P}$ and $LB_{2P}$ to irradiate the diffraction grating mark and the diaphragm member 73 to rotate simultaneously. In this way, the irradiation areas of the beams $LB_{1P}$ and $LB_{2P}$ are being shifted in the direction Y on the diffraction grating mark 80. The phase detecting system 27 detects the phase difference $\Phi_{W6}$ between the light beat signal $SD_W$ output from the photoelectric detector 56 and the reference signal SR when the oblong aperture 15s and the slit 73a are overlapped, and outputs this phase difference information to the main control system 28. Thereafter, with the same operation, the phase detecting system 27 detects the phase differences $\Phi_{W7}$ and $\Phi_{W8}$ between the light beat signal $SD_W$ and the reference signal SR for each of the slits 73b and 73c and outputs each of them to the main control system 28.

Figure 15:
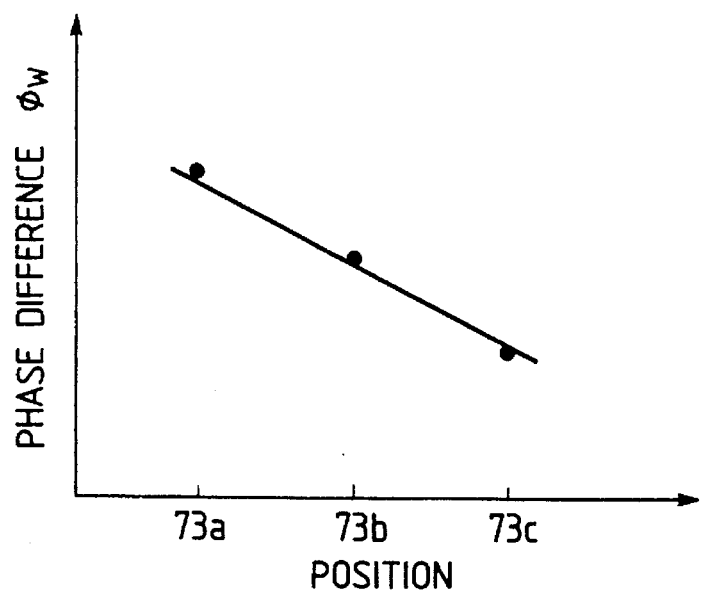
FIG. 15 is a graph used for the explanation of the operation to measure the rotational error of the two beams.

FIG. 15 represents the positions of the slits 73a to 73c, that is, the phase difference $\Phi_W$ for each of the positions of irradiation area in the direction Y on the diffraction mark 80. Then, the main control system 28 calculates the rotational error ω of the interference fringes with respect to the diffraction grating mark 80 on the basis of the aforesaid phase difference information ($\Phi_{W6}$ to $\Phi_{W8}$). The rotational error ω is also calculated from the variable amounts (i.e., the inclination of the straight line in FIG. 15) of the phase differences $\Phi_{W6}$ to $\Phi_{W8}$ for each of the irradiation areas on the diffraction grating mark 80. In this respect, the rotational error ω is also obtainable by the expression (12) given below by the same method as the above-mentioned method of obtaining the pitch deviation amount $\Delta P_f$ (setting the linear function by the method of least squares). Here, therefore, its explanation will be omitted. In the expression (12), however, $K_1'$ is the inclination of the linear function represented in FIG. 15. Also, the rotational error ω being a minute amount, it is expressed approximately in the expression (12):

$$\omega \approx k_1' \cdot \frac{P_f}{2\pi} \tag{12}$$

Subsequently, the main control system 28 calculates the angles of inclination of the parallel flat glass 74b, and the angles of inclination of the parallel flat glass 70b for correcting the telecen inclination of the beams $LB_{1P}$ and $LB_{2P}$ generated accompanying the inclination of the parallel flat glass 74b. The parallel flat glass 74b is driven to shift the spot of the beam $LB_{2P}$ in the direction Y at the pupil plane Ep, and the parallel flat glass 70b is driven to shift each of the spots of the beams $LB_{1P}$ and $LB_{2P}$ in the direction Y so that each of them become symmetrical with the pupil center therebetween while the interval between each of the spots being left as it is. As a result, the rotational adjustment for the beam $LB_{1P}$ and $LB_{2P}$ is completed, and the rotational error ω of the beams $LB_{1P}$ and $LB_{2P}$ is confined substantially to zero without generating the telecen inclination of the beams $LB_{1P\ 1P}$ and $LB_{2P\ 2P}$ on the exit side of the objective lens 22.

Here, in correcting the rotational error ω, if the parallel flat glasses 74a and 74b are driven simultaneously, it is possible to prevent any changes in the intersecting angles $2θ_W$ of the beams $LB_{1P}$ and $LB_{2P}$ following the rotational adjustment because the spot of the beam $LB_{2P}$ can be shifted while keeping the interval between each of the spots of the beams $LB_{1P}$ and $LB_{2P}$ constant at the pupil plane Ep. Likewise, by driving the parallel flat glasses 70a and 70b at the same time, the telecen inclination can be corrected with a higher precision.

In this respect, as clear from the above-mentioned embodiment, it is needless to mention that just by changing the positional relation between the diaphragm member 72 and the oblong aperture 15s of the field diaphragm 15, the diaphragm 72 for the use of the intersecting angle measurement can be used as the diaphragm member 73 for the use of the rotational error measurement without any modifications. The same is applicable to the reverse case.

Figure 16:
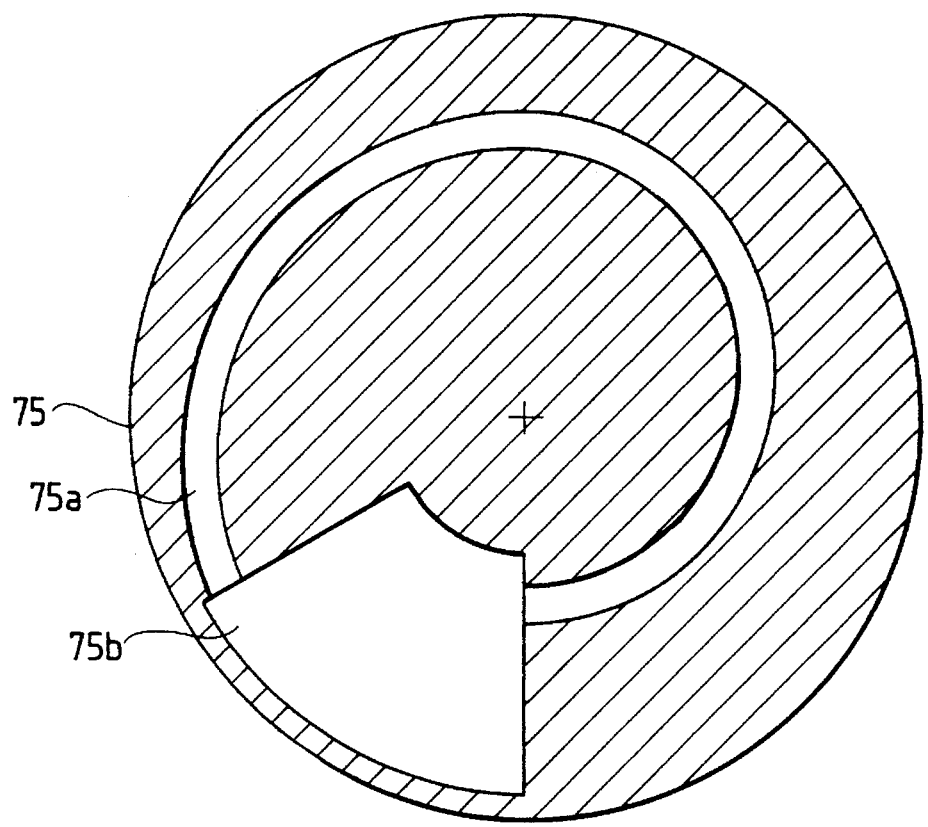
FIG. 16 is a view showing an example of the diaphragm member which is suited for the measurement of the two-beam intersecting angles (or the rotational error).
Figure 17:
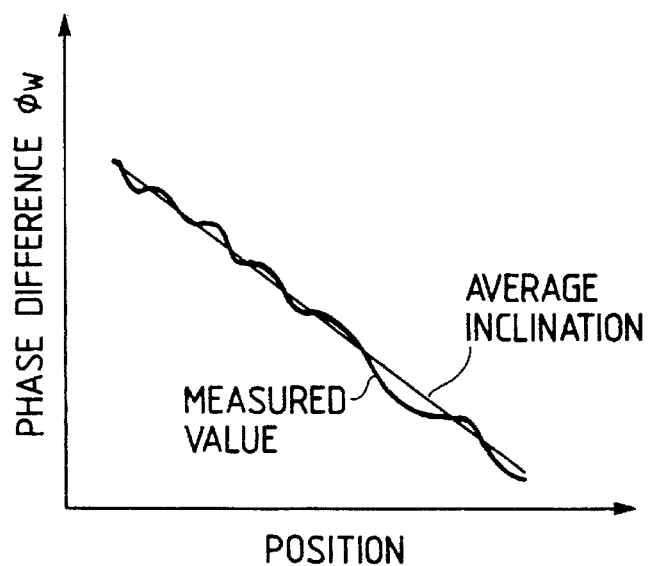
FIG. 17 is a graph used for the explanation of the operation to measure the intersecting angles of the two beams using the diaphragm member shown in FIG. 16.

Now, with reference to FIG. 16, a description will be given of another slit configuration of the diaphragm member which is suited for the measurement of the intersecting angles (or rotational error). As shown in FIG. 16, the diaphragm member 75 is a disc formed with a spiral (helical) fine slit 75a and a fan type aperture 75b. Therefore, when the diaphragm member 75 is rotated, the illumination areas of the beam $LB_{1P}$ and $LB_{2P}$ are continuously moved in the direction X (or Y) on the diffraction grating mark 80. Here, FIG. 17 shows the detection results using the diaphragm member 75 for the measurements of the intersecting angles, for example. As clear from FIG. 17, the illumination area is continuously moved on the diffraction grating mark 80. Accompanying this, the measured values (phase differences $Φ_W$) indicated by a solid line also vary continuously. In such a case, it is also possible to calculate intersecting angle (or rotational error) by obtaining the inclination of the approximately straight line from the measurement results (solid line).

Figure 18:
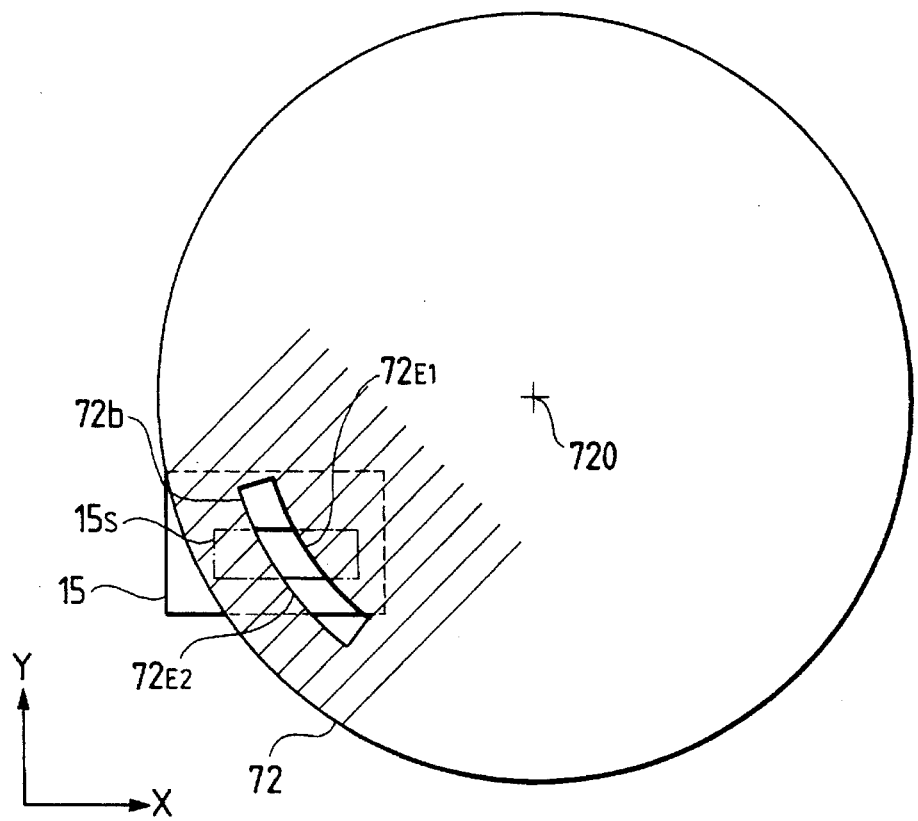
FIG. 18 is a view showing another example of the diaphragm member Which is suited for the measurement of the two-beam intersecting angles (or the rotational error).

Also, as shown in FIG. 8, according to the present embodiment, the field diaphragm 15 is arranged with respect to the diaphragm member 72 in such a manner that the extension lines of the two edges of its oblong aperture 15s in the longitudinal direction place the rotational center 72O of the diaphragm member 72 substantially in the center between them. In contrast, here, the field diaphragm 15 and the diaphragm 72 (rotational center 72O) are relatively shifted in the direction Y, for example, to establish a positional relation as shown in FIG. 18. In this respect, only a part of the diaphragm member 72 is represented in FIG. 18. In this way,, the edge portions $72_{E1}$ and $72_{E2}$ of the slit 72b which are overlapped with the oblong aperture 15s can be inclined in the direction of the grating arrangement (direction X) of the diffraction grating mark 80. As a result, it becomes difficult for the diffraction rays of light generated from the edge portions $72_{E1}$ and $72_{E2}$ to enter the photoelectric detector 56. Hence enabling a high precision deviation detection to be preformed in a better condition. This is disclosed in U.S. Ser. No. 482,557, for example, and here the description thereof will be omitted.

Figure 19:
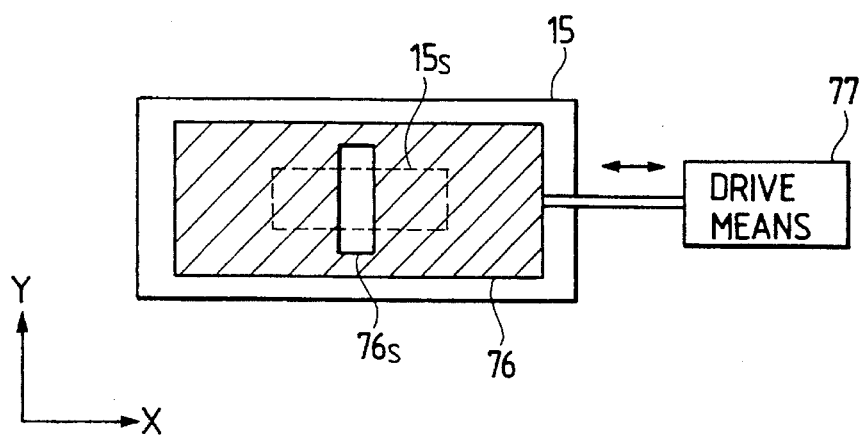
FIG. 19 is a view showing another example of the diaphragm member which is suited for the measurement of the two-beam intersecting angles (or the rotational error).

Further, in the above-mentioned embodiment, while a rotational disc is used for the diaphragm members 72 and 73, it may be possible to arrange the structure so that a diaphragm member 76 having its oblong aperture 76s such as shown in FIG. 19 is driven by driving means 77 linearly in the direction of the grating arrangement (direction X) with respect to the field diaphragm 15, or to arrange the structure so that the position and shape of the field diaphragm 15 can be variable using a liquid crystal element, electrochromic element, or the like.

Figure 20:
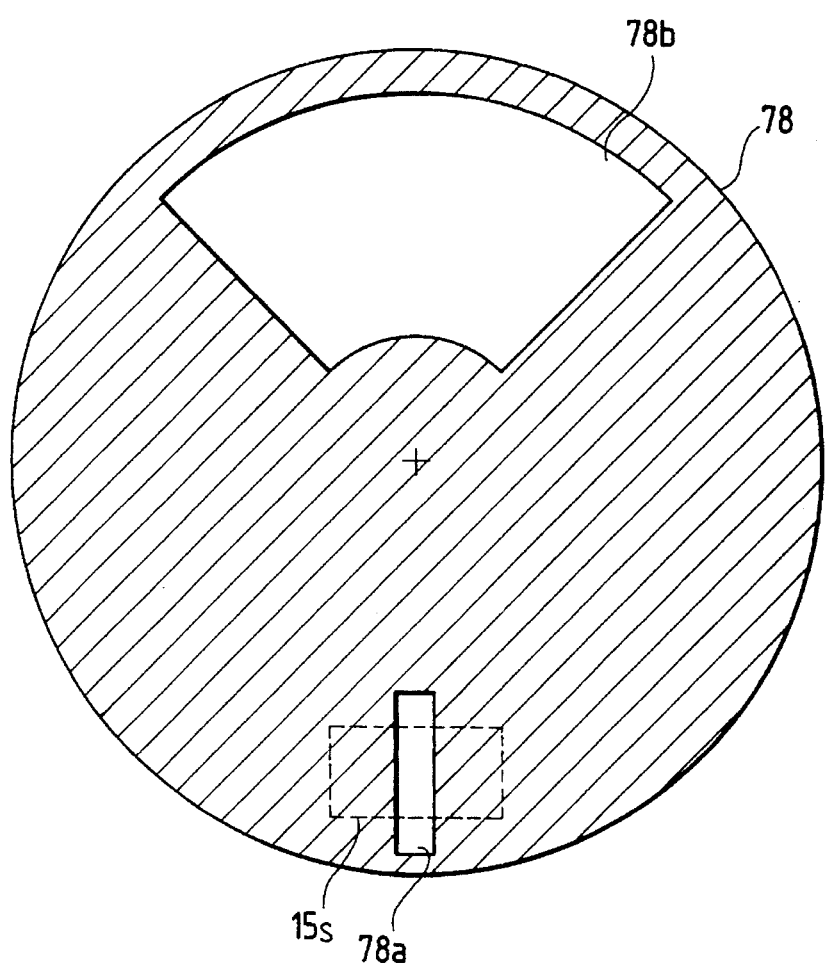
FIG. 20 is a view showing another example of the diaphragm member which is suited for the measurement of the two-beam intersecting angles (or the rotational error).
Figure 21:
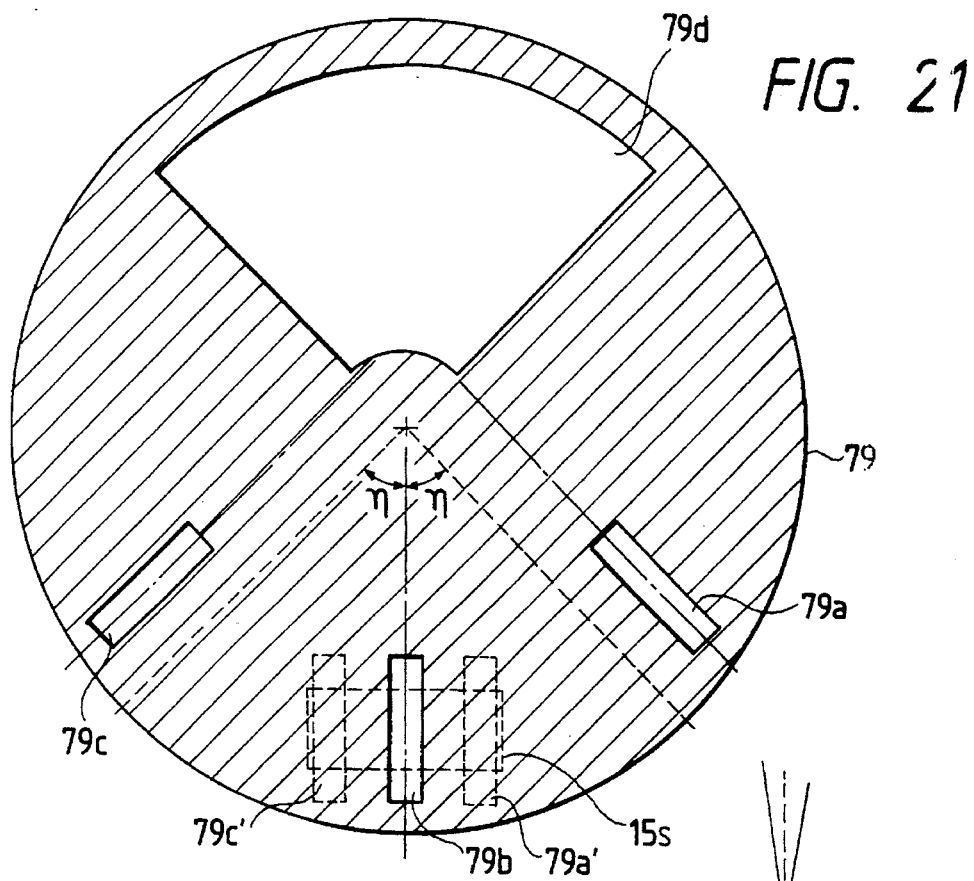
FIG. 21 is a view showing another example of the diaphragm member which is suited for the measure of the two-beam intersecting angles (or the rotational error).

Also, as shown in FIG. 20, it may be possible to use a diaphragm member 78 having an oblong aperture 78a and a fan type aperture 78b. In this case, there is an advantage that it will suffice if only one fine slit is formed on the rotational disc. Further, as shown in FIG. 21, it may be possible to use a diaphragm member 79 having three fine slits 79a to 79c, for example, and a fan type aperture 79d. In this case, each of the fine slits 79a to 79c can be shifted step by step substantially in parallel with respect to the oblong aperture 15s by rotating the diaphragm member 79 sequentially each at a given angle of η with respect to the oblong aperture 15s. In this respect, the state where the fine slits 79a and 79c are overlapped with the oblong aperture 15s is represented by the dotted lines 79a' and 79c' in FIG. 21.

Further, in adjusting the intersecting angles or the rotational error according to the present invention, the illumination areas of the two beams $LB_{1P}$ and $LB_{2P}$ on the grating mark 80 are confined by the use of the two diaphragm members 15 and 72 or 15 and 73. However, if, for example, an aperture signals applied to the AOMs 33 and 34. Then, if the frequency of the drive signals is adjusted in accordance with the above-mentioned rotational error ω and others, the minute adjustments of the intersecting angle and rotational error can be made by the AOMs 33 and 34 without the provision of the parallel flat glasses 74a and 74b. Particularly, as regards the adjustment of the intersecting angles (pitch of the interference fringes), it may be possible to make the focal length of the lens 17 variable so that the focal length thereof can be adjusted. On the other hand, as regards the rotational error, it may be possible to allow the image rotator arranged on the light paths of the beams $LB_{1P}$ and $LB_{2P}$ to be rotated. In this respect, there is no problem in adjusting the intersecting angles (pitch of the interference fringes) earlier than the rotational error and vice versa in the above-mentioned embodiment.

Further, in the above-mentioned embodiment, the diaphragm members 72 and 73 for measuring the intersecting angles and rotational error are arranged in the vicinity of the wafer conjugate plane IP' on the light emitting system side as shown in FIG. 3. However, there is no problem in arranging the diaphragm members 72 and 73 at any place if only they are provided on the wafer conjugate plane or its vicinity. For example, it may be possible to arrange which is exactly the same as the oblong aperture 15s of the field diaphragm 15 is formed with respect to each of the diaphragm members 72 and 73, there is no need for the field diaphragm 15, and it is clear that a same effect as the above-mentioned embodiment can be obtained only by the two diaphragm members 72 and 73. However, it is necessary for the diaphragm members 72 and 73 to provide a highly precise rotary encoder and others for each of its driving portions.

As described above, in the above-mentioned embodiment, while the parallel flat glasses 74a and 74b for correcting the intersecting angles and rotational error are arranged in the two-light beam frequency shifter 11, particularly, on the light path of the beam $LB_2$ (FIG. 2), there is no problem in arranging the parallel flat glasses 74a and 74b at any place between the laser light source 10 and the objective optical system 22. Furthermore, it may be possible to arrange the parallel flat glasses 70a and 70b at any place between the laser light source 10 and the wafer W.

Also, at least one of the AOMs 33 and 34, which have been described earlier, should be arranged at the position where the polarization origin thereof is conjugative with the pupil or its vicinity and at the same time, a driving circuit is provided to increase or decrease the frequency of the drive them in the first measuring signal making part 20 or more specifically, on the wafer conjugate plane between the lenses 51 and 52.

Also, in the above-mentioned embodiment, while a description has been given of the adjustment operation on the intersecting angles and rotational error of the beams $LB_{1P}$ and $LB_{2P}$ on the wafer, if, for example, the diaphragm member 72 is rotated in adjusting the intersecting angles, the illumination areas of the two beams $RL_1$ and $RL_2$ are also allowed to be shifted sequentially on the fiducial grating plate 48 as well as on the diffraction mark 80. Therefore, by detecting the phase difference $\Phi_R$ between the light beat signal $SD_R$ output from the photoelectric detector 50 and the reference signal SR at each position in the illumination areas of the beams $RL_1$ and $RL_2$ sequentially, it is possible to calculate the deviation amount of the pitches of the beams $RL_1$ and $RL_2$ with respect to the grating pitch of the fiducial grating plate 48 by the same operation as the above-mentioned embodiment. Likewise, if the diaphragm member 75 is rotated, it is possible to obtain the rotational error of the beams $RL_1$ and $RL_2$ (interference fringes) with respect to the direction of the grating arrangement (measurement direction) of the fiducial grating plate 48.

In this case, if the fiducial grating plate 48 and reticle R are fixed to the stepper accurately, the rotational error $\omega_W$ between the two beams $LB_{1P}$ and $LB_{2P}$ and the wafer mark WM in the measurement direction, and the rotational error $\omega_R$ between the two beams $RL_1$ and $RL_2$ and the fiducial grating plate 48 in the measurement direction are almost equal. Therefore, if the correction is made by the same operation as the above-mentioned embodiment on the basis of either one of the rotational errors, the rotational error $\omega_W$, for example, the rotational error $\omega_R$ on the reticle R (fiducial grating plate 48) side also becomes almost zero at the same time.

On the other hand, as regards the intersecting angles $2\theta_W$ of the beams $LB_{1P}$ and $LB_{2P}$ and the intersecting angles $\theta_{RG}$ of the beams $RL_1$ and $RL_2$, it is rather difficult to predict that the intersecting angles $\theta_{RG}$ of the beams $RL_1$ and $RL_2$ will be accurately established when the intersecting angles $2\theta_W$ of the beams $LB_{1P}$ and $LB_{2P}$ are adjusted, for example, because the aberration compensation is given to the projection lens PL in accordance with the exposure frequency and the chromatic aberration is generated in the TTR type alignment system having the He-Ne laser and others as its light source. In the TTR type, therefore, the intersecting angles (that is, the pitch of the interference fringes) are measured each for the reticle R (fiducial grating plate 48) and wafer W by the same operations as the above-mentioned embodiment, and the interval between each of the spots of the beams $LB_{1P}$ and $LB_{2P}$ at the pupil plane of the alignment system is adjusted in accordance with the values obtained by averaging these measured values, for example. Thus correcting the intersecting angles $2\theta_W$ and $\theta_{RG}$ to obtain the same effects as the above-mentioned embodiment.

In this respect, when the intersecting angles $2\theta_W$ of the two beams $LB_{1P}$ and $LB_{2P}$ or the intersecting angles $\theta_{RG}$ of the beams $RL_1$ and $RL_2$, are measured, and the deviation amount $\Delta P_f$ of the pitch of the interference fringes on the wafer is measured by the use of the fiducial member FM, it may also be possible to adjust the intersecting angles $2\theta_W$ of the beams $LB_{1P}$ and $LB_{2P}$ alone in accordance with the value thus obtained. In this method, although it is not necessarily assured that the intersecting angles $\theta_{RG}$ of the beam $RL_1$ and $RL_2$ are accurately established, there occurs almost no optical irregularity locally in the diffraction mark, that is, the partial irregularity of the intensity of the diffraction light from the grating mark, for example, because the reticle marks $RM_1$ and $RM_2$, and fiducial plate 48 are made of the thin chrome film and others with the patterns (diffraction gratings) formed by etching in most cases, and the diffraction gratings here can be considered as having gratings of even strength, hence occurring almost no degradation of the detecting precision on the side of the reticle R. Also, if any alignment error remains for the reticle R, there is a possibility that the same event which has taken place in the case of the intersecting angles $\theta_{RG}$ and $2\theta_W$ occurs with regard to the above-mentioned rotational errors $\omega_R$ and $\omega_W$. Therefore, it is desirable to perform the aforesaid averaging treatment also in correcting the rotational errors $\omega_R$ and $\Phi_W$.

Now, a relay lens system is arranged between the lens 17 and fiducial grating plate 48 in FIG. 3, for example, and by providing the parallel flat glasses in the space therebetween in such a manner that they can be slanted, it becomes possible to adjust only the intersecting angles $\theta_{RG}$ and rotational error $\omega_R$ of the beams $RL_1$ and $RL_2$ on the fiducial grating plate 48 independently. Therefore, if the intersecting angles and rotational error of the two beams on the reticle (fiducial grating plate) side are adjusted, there is no need to conduct any averaging treatment such as mentioned above. Thus, the intersecting angles and rotational errors on both sides of wafer and reticle can be adjusted with a high precision in a better condition. With the adoption of a structure such as this, the parallel flat glasses 70a and 70b, and 74a and 74b can be slanted by the same operation as the above-mentioned embodiment in order to adjust the intersecting angles and rotational error of the beams $LB_{1P}$ and $LB_{2P}$, and then, the diaphragm members 72 and 73 are again rotated to measure the intersecting angles (pitch deviation amount of the interference light) and rotational error of the beams $RL_1$ and $RL_2$ on the fiducial grating plate 48. Now, on the basis of the result of this measurement, the aforesaid parallel flat glass is slanted so as to make it possible to adjust the intersecting angles and others on the wafer side and reticle (fiducial grating plate) side independently. In this respect, even if the reticle alignment error (particularly, rotational component) remains or the reticle and wafer are once rotated relatively prior to the exposure for each shot or one wafer in order to correct the relative rotational error between the shot area on the wafer and projection image of the reticle pattern, it is possible to prevent by adopting the structure described above the degradation of the alignment precision of the alignment system resulting from such an aspect or a step taken. In this respect, however, when the reticle and wafer are rotated relatively for each shot, such an amount of rotation is so minute that it is unnecessary to conduct the above-mentioned adjustment for every shot.

Figure 22:
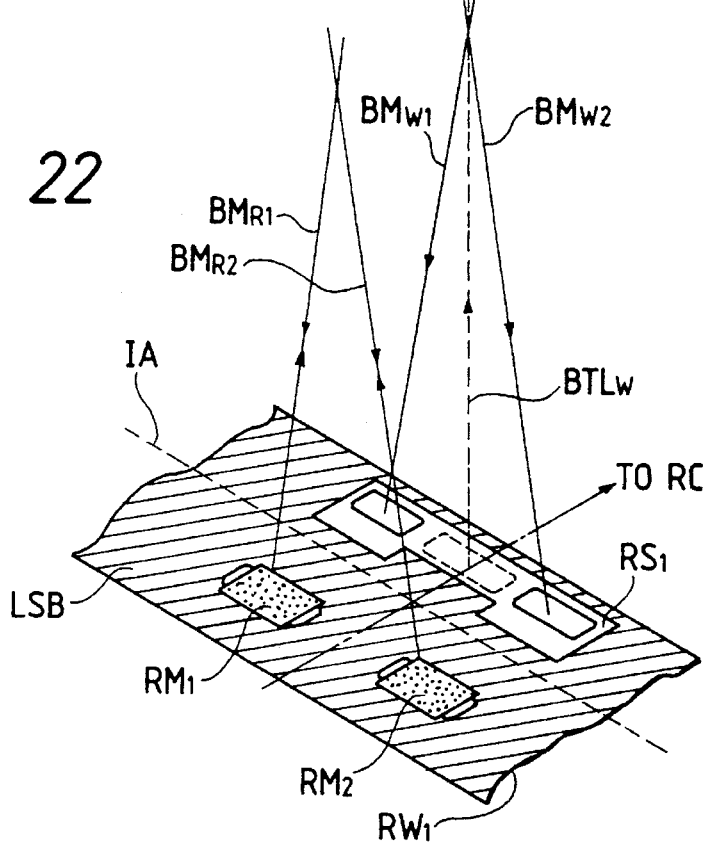
FIG. 22 is a perspective view showing an example of a variation of the alignment system shown in FIG. 1.

Now, as clear from FIG. 3 and FIG. 6, the structure arranged in the above-mentioned embodiment is such that the wafer mark WM and reticle marks $RM_1$ and $RM_2$ (that is, fiducial grating plate 48) are illuminated only by the two beams $LB_{1P}$ and $LB_{2P}$, but it may be possible to arrange a structure so that the irradiation is given by four beams, each two independent beams for the wafer mark WM and reticle marks $RM_1$ and $RM_2$, respectively. In other words, as shown in FIG. 22, the beams $BM_{R1}$ and $BM_{R2}$ are irradiated onto the transparent window R of the reticle, that is, reticle marks $RM_1$ and $RM_2$, while the beams $BM_{W1}$ and $BM_{W2}$ are irradiated onto the wafer mark (transparent portion $RS_1$). With a structure such as this, it is possible to establish the interval between the transparent portion $RS_1$ and the reticle marks $RM_1$ and $RM_2$ large so that the noise component (Lo, for example) which may enter the photoelectric detectors 50 and 56 can be cut with ease. Hence enabling the enhancement of the detecting precision of the alignment system. In this case, each beam diameter of the beams $BM_{W1}$ and $BM_{W2}$ which pass the transparent portion $RS_1$ should desirably be made sufficiently smaller than the transparent portion $RS_1$. Then, it becomes possible to prevent any diffraction light generated by the edges of the transparent portion $RS_1$ from entering the photoelectric detector 56. This is also applicable to the beams $BM_{R1}$ and $BM_{R2}$ exactly. Here, in order to irradiate the four beams onto the transparent window $RW_1$, an optical member (prism or the like) should be arranged between the lenses 14 and 17, for example, or it will suffice if only two sets of two-light beam frequency shifters are arranged.

Further, in the apparatus of such a structure as shown in FIG. 22, it is possible to define the intersecting angles and rotational errors independently for the respective two incident beams $BM_{R1}$ and $BM_{R2}$, and $BM_{W1}$ and $BM_{W2}$ to the reticle R and wafer W. In this case, however, it is also necessary to establish each of the diffraction rays of light of the incident beams $BM_{R1}$ and $BM_{R2}$ to the reticle R on the reticle marks $RM_1$ and $RM_2$ so that they can intersect within the above-mentioned focus plane 25 and at the same time, it is necessary to make an arrangement so that each diffraction light should return coaxially to the main rays of light of the two beams for the grating pitch $P_R$ of the reticle marks $RM_1$ and $RM_2$ as well. Here, if the intersecting angles of the beams $BM_{R1}$ and $BM_{R2}$, and $BM_{W1}$ and $BM_{W2}$ are established independently, an effect will be produced particularly when there is magnification chromatic aberration for the projection lens PL. In other words, when the positions of the alignment system (metal 24) are changed in accordance with the positional change of the transparent window $RW_1$ of the reticle R, the magnification of the two beams $BM_{W1}$ and $BM_{W2}$ irradiated onto the wafer W varies. Therefore, it is necessary to change the intersecting angles $2\theta_W$ of the two beams in response to the magnification variation. Nevertheless, in the above-mentioned structure, the intersecting angles on the reticle (fiducial grating plate) side can be maintained constantly even when the intersecting angles $2\theta_W$ are changed. Thus making it possible to produce such as effect.

Also, in the above-mentioned embodiment, while a description has been given of the case where the present invention is applied to a heterodyne type alignment system, it is needless to mention that the present invention is effectively applicable to the measurement and adjustment of the intersecting angles and rotational error of the two beams in a system in which by a homodyne method or by differentiating the polarization components of the two beams to be irradiated onto the wafer mark WM without producing any interference fringes on the mark, the polarized P light beam and polarized S light beam, which return from the mark coaxially along the optical axis AX, are made into the interference light by an analyzer (multi-diffraction plate) and then the detection is preformed photoelectrically. Further, the alignment system is not confined to the TTR method. There is no problem in adopting a TTL method or off-axis method. An alignment apparatus according to the present invention is applicable not only to a stepper-aligner, but also to an aligner (X-ray aligner and the like) of a proximity type, contact type, or step-and-scan type, or further, to various inspection apparatus as a matter of course.

What is claimed is:

1. An alignment apparatus which detects a diffraction grating formed on a substrate by using two beams having a predetermined difference in frequency, comprising:

a movable stage which holds a substrate;

a fiducial grating plate which is provided on said stage;

a light transmission system which irradiates said fiducial grating plate with two beams at a given intersecting angle, said light transmission system including an objective optical system which emits said two beams toward said fiducial grating plate and a field diaphragm which is arranged at a plane conjugate with said fiducial grating plate with respect to said objective optical system;

a photoelectric detector which receives interference light of diffraction rays of light that are generated substantially in one and the same direction from an intersecting area of said two beams on said fiducial grating plate, restricted by said field stop;

a diaphragm member which is provided independent of said field diaphragm and which partially shields said intersecting area on said fiducial grating plate; and a measuring device which measures said intersecting angle of said two beams or a rotational error of a crossing line between said fiducial grating plate and a plane containing principal rays of said two beams with respect to a direction of grating arrangement of said fiducial grating plate, based on first and second detection signals, said first detection signal being generated from said photoelectric detector when a first area within said intersecting area is shielded by said diaphragm member, and said second detection signal being generated from said photoelectric detector when a second area within said intersecting area is shielded by said diaphragm member, said first and second areas having at least portions thereof that differ from each other.

2. An apparatus according to claim 1, wherein said diaphragm member is disposed at a plane conjugate with said fiducial grating plate in said light transmission system.

3. An apparatus according to claim 1, wherein said diaphragm member is disposed adjacent to said field diaphragm.

4. An apparatus according to claim 1, wherein said measuring device is provided with a circuit which detects a phase difference between said first and second detection signals and an operator which calculates said rotational error or said intersecting angle based on said phase difference.

5. An apparatus according to claim 1, wherein said two beams pass through a pupil plane of said objective optical system spaced apart from each other at a given interval; and further comprising:

an optical member which changes a position of at least one of said two beams within said pupil plane of said objective optical system in order to adjust said rotational error or said intersecting angle.

6. An apparatus according to claim 5, wherein said optical member includes a first optical element which changes an interval between said two beams within said pupil plane of said objective optical system and a second optical element which changes the position of at least one of said two beams within said pupil plane of said objective optical system in a direction perpendicular to said direction of grating arrangement of said fiducial grating plate.

7. An apparatus according to claim 6, wherein said first and second optical elements are both parallel plane flat glasses.

8. An alignment apparatus which detects a diffraction grating formed on a substrate by using two beams having a predetermined difference in frequency, comprising:

a movable stage which holds a substrate;

a fiducial grating plate which is provided on said stage;

a light transmission system which irradiates said fiducial grating plate with two beams at a given intersecting angle, said light transmission system including an objective optical system which emits said two beams toward said fiducial grating plate and a field diaphragm which is arranged at a plane conjugate with said fiducial grating plate with respect to said objective optical system;

a photoelectric detector which receives interference light of diffraction rays of light that are generated substantially in one and the same direction from an intersecting area of said two beams on said fiducial grating plate, restricted by said field diaphragm;

a diaphragm member which is provided, independent of said field diaphragm, at said plane conjugate with said fiducial grating plate with respect to said objective optical system and through which said two beams partially pass toward said fiducial grating plate; and a measuring device which measures at least one of said intersecting angle of said two beams and a rotational error of a crossing line between said fiducial grating plate and a plane containing principal rays of said two beams with respect to a direction of grating arrangement of said fiducial grating plate, based on plural detection signals generated from said photoelectric detector when said two beams are irradiated sequentially onto each of plural local areas within an intersecting area on said fiducial grating plate through said diaphragm member, said plural local areas having at least portions thereof that differ from each other.

9. An apparatus according to claim 8, wherein said diaphragm member is disposed adjacent to said field diaphragm.

10. An apparatus according to claim 8, wherein said diaphragm member is provided with an opening through which a part of said two beams passes and which can be moved within said plane conjugate with said fiducial grating plate.

11. An apparatus according to claim 8, wherein said diaphragm member is rotatable on a rotational axis spaced apart from an optical axis of said objective optical system and is provided with plural openings through which a part of said two beams passes, the distances of said plural openings from said rotational axis being different from each other.

12. An apparatus according to claim 8, wherein said diaphragm member is rotatable on an axis spaced apart from an optical axis of said objective optical system and is provided with a spiral opening through which a part of said two beams passes.

13. An apparatus according to claim 8, wherein said diaphragm member includes a first diaphragm through which said two beams partially pass in such a manner that each of said plural local areas deviates in a direction of grating arrangement of said fiducial grating plate, and a second diaphragm through which said two beams partially pass in such a manner that each of said plural local areas deviates in a direction perpendicular to the direction of the grating arrangement of said fiducial grating plate.

14. An apparatus according to claim 13, wherein said first diaphragm has an opening through which a part of said two beams passes, said opening extending in a direction perpendicular to the direction of grating arrangement of said fiducial grating plate and wherein said second diaphragm has an opening through which a part of said two beams passes, the last-mentioned opening extending in the direction of the grating arrangement of said fiducial grating plate.

15. An apparatus according to claim 8, wherein said measuring device includes a circuit which produces a reference signal having the same frequency as said predetermined difference in frequency, a circuit which detects phase differences between said plural detection signals and said reference signal, and an operator which calculates at least one of said rotational error and said intersecting angle based on said phase differences.

16. An apparatus according to claim 8, wherein said two beams pass through a pupil plane of said objective optical system spaced apart from each other at a given interval; and further comprising:

an optical member which changes a position of at least one of said two beams within said pupil plane of said objective optical system.

17. An apparatus according to claim 16, wherein said optical member includes a first optical element which changes an interval between said two beams within said pupil plane of said objective optical system, and a second optical element which changes a position of at least one of said two beams within said pupil plane of said objective optical system in a direction perpendicular to the direction of the grating arrangement of said fiducial grating plate.

18. An apparatus which transfers a pattern formed on a mask onto a sensitive substrate, comprising:

a projection optical system which projects a pattern formed on a mask onto a sensitive substrate;

a light transmission system which irradiates each of a first mark of diffraction-grating-shape on said mask and a second mark of diffraction-grating-shape on said sensitive substrate with two beams having a predetermined difference in frequency, the light transmission system being provided with an objective optical system which emits said two beams toward said substrate in such a manner that said two beams, after passing through said mask and said projection optical system, intersect on said second mark, and a field diaphragm which is disposed at a plane conjugate with said second mark;

a first photoelectric detector which receives diffraction light generated from said first mark and passing through said objective optical system;

a second photoelectric detector which receives interference light of diffraction rays of light that are generated substantially in one and the same direction from said second mark and passing through said projection optical system;

a movable stage which holds said sensitive substrate;

a fiducial grating plate provided on said stage;

a diaphragm member which is disposed, independent of said field diaphragm, at a plane conjugate with said fiducial grating plate and through which said two beams partially pass toward said fiducial grating plate, said two beams being irradiated sequentially onto each of plural local areas within an intersecting area of said two beams on said fiducial grating plate, restricted by said field diaphragm; and a measuring device which measures at least one of an intersecting angle of said two beams and a rotational error of a crossing line between said fiducial grating plate and a plane containing principal rays of said two beams with respect to a direction of grating arrangement of said fiducial grating plate, based on plural detection signals generated from said second photoelectric detector corresponding to each of said plural local areas, said plural local areas having at least portions thereof that differ from each other.

19. An alignment apparatus comprising:

a stage which holds a substrate and on which a grating plate is provided;

an illumination system which irradiates said grating plate with two beams having a predetermined difference in frequency, through an objective optical system;

a first field diaphragm which is arranged at a plane substantially conjugate with said grating plate with respect to said objective optical system;

a photoelectric detector which receives diffraction rays of light that are generated from an intersecting area of said two beams on said grating plate, restricted by said first field diaphragm;

a second field diaphragm which is provided independent of said first field diaphragm and which selectively shields said intersecting area on said grating plate; and a device which measures a condition of an interference fringe, within said intersecting area, generated by said two beams, based on plural signals generated from said photoelectric detector when said two beams are irradiated sequentially onto each of plural local areas within said intersecting area on said grating plate through said second field diaphragm, said plural local areas having at least portions thereof that differ from each other.

* * * * *